United States Patent
Tomizawa et al.

(10) Patent No.: US 9,368,692 B2
(45) Date of Patent: Jun. 14, 2016

(54) ELECTRONIC COLOR-CHART DEVICE

(71) Applicant: Sharp Kabushiki Kaisha, Osaka-shi, Osaka (JP)

(72) Inventors: Kazunari Tomizawa, Osaka (JP); Yoshifumi Shimodaira, Hamamatsu (JP)

(73) Assignees: SHARP KABUSHIKI KAISHA, Osaka (JP); NATIONAL UNIVERSITY CORPORATION SHIZUOKA UNIVERSITY, Shizuoka (JP)

( * ) Notice: Subject to any disclaimer, the term of this patent is extended or adjusted under 35 U.S.C. 154(b) by 0 days.

(21) Appl. No.: 14/428,133

(22) PCT Filed: Sep. 10, 2013

(86) PCT No.: PCT/JP2013/074341
§ 371 (c)(1),
(2) Date: Mar. 13, 2015

(87) PCT Pub. No.: WO2014/042140
PCT Pub. Date: Mar. 20, 2014

(65) Prior Publication Data
US 2015/0263240 A1    Sep. 17, 2015

(30) Foreign Application Priority Data

Sep. 14, 2012   (JP) .................................. 2012-202912

(51) Int. Cl.
*F21V 9/00*          (2015.01)
*H01L 33/50*         (2010.01)
(Continued)

(52) U.S. Cl.
CPC . *H01L 33/50* (2013.01); *F21K 9/00* (2013.01); *G01J 3/0251* (2013.01); *G01J 3/10* (2013.01);
(Continued)

(58) Field of Classification Search
CPC ............. G01J 3/10; G01J 3/52; G01J 3/0251; G01J 2003/104; H05B 33/0845; H05B 33/0857; H01L 33/50; F21K 9/00; F21Y 2101/02
See application file for complete search history.

(56) References Cited

U.S. PATENT DOCUMENTS 8,840,267 B2 * 9/2014 Li ........................ G02B 27/149
                                                      362/231
2009/0046453 A1   2/2009 Kramer

FOREIGN PATENT DOCUMENTS

JP     2002-199231 A    7/2002
JP        3790693 B2    6/2006
(Continued)

OTHER PUBLICATIONS

International Search Report PCT/ISA/210 for International Application No. PCT/JP2013/074341 dated Dec. 8, 2013.

*Primary Examiner* — Thomas M Sember
(74) *Attorney, Agent, or Firm* — Harness, Dickey & Pierce, P.L.C.

(57) ABSTRACT

An electronic color-chart device includes plural LEDs with different peak wavelengths and displays images to serve as color references as color charts by making the plural LEDs emit light. In a case where a light emission intensity distribution of each of the plural LEDs is normalized with a maximum intensity being a value of 1, the plural LEDs include plural first LEDs of which at least one is an LED whose full wavelength width at half maximum intensity is 40 nm or narrower and between which a peak interval is 50 nm or narrower and a second LED whose light emission intensity at a wavelength of 555 nm is 0.4 or higher, and whose full wavelength width at half maximum intensity is wider than 40 nm.

7 Claims, 29 Drawing Sheets

(51) Int. Cl.
- *G01J 3/52* (2006.01)
- *G01J 3/02* (2006.01)
- *G01J 3/10* (2006.01)
- *F21K 99/00* (2016.01)
- *H05B 33/08* (2006.01)
- *F21Y 101/02* (2006.01)

(52) U.S. Cl.
CPC ............... *G01J 3/52* (2013.01); *H05B 33/0845* (2013.01); *H05B 33/0857* (2013.01); *F21Y 2101/02* (2013.01); *G01J 2003/104* (2013.01)

(56) References Cited

FOREIGN PATENT DOCUMENTS

| | | |
|---|---|---|
| JP | 2009-088374 A | 4/2009 |
| WO | WO-2006/119750 A2 | 11/2006 |

\* cited by examiner

US 9,368,692 B2

ELECTRONIC COLOR-CHART DEVICE

CROSS REFERENCE TO RELATED APPLICATIONS

This is a National Phase Application of PCT/JP2013/074341 filed Sep. 10, 2013, which is an International Application claiming priority to Japanese Application No. 2012-202912, filed on Sep. 14, 2012, the entire contents of which are hereby incorporated by reference.

TECHNICAL FIELD

The present invention relates to an electronic color-chart device that displays color charts that serve as references of plural colors (color samples) by using plural light emitting diodes (LED).

BACKGROUND ART

A color chart is used as a reference in evaluating photographing performance or adjusting (correcting) the photographing performance of a camera or the like. Various colors are used for the color chart, as chiefly represented by the Macbeth chart. For example, it may be said that the photographing performance is higher in a case where when "white" of the color chart is photographed by the camera, the color of an image obtained by the photographing is closer to "white" in the color chart. Such a color chart is typically printed on paper. However, it is desired to electronically manage and display the color chart in rapid development of digital technologies in recent years.

In related art, for example, PTL 1 discloses an electronic color-chart device that electronically displays the color charts. The electronic color-chart device displays the color charts that serve as color references by using plural LEDs that have spectral characteristics as illustrated in FIG. 28. More specifically, a sufficient color gamut for expressing colors of reflecting objects existing in the natural world is obtained by using plural LEDs that emit light of colors of blue, blue-green, green, green-yellow, yellow, and red and that are 30 LEDs in total and by making the LEDs emit light by controlling values of current applied to the LEDs or duty ratios (a ratio between a time of application of current and a time of non-application of current). Two kinds of LEDs, one of which has a filter that cuts a high wavelength side of light emission wavelengths and the other of which does not have such a filter but has broad light emission characteristic, are used for the LEDs whose peak wavelengths are around 420 nm in order to realize purple-blue with a high chroma.

CITATION LIST

Patent Literature

PTL 1: Japanese Patent No. 3790693 (see claim 1, paragraphs [0019] to [0032], FIG. 8, and so forth)

SUMMARY OF INVENTION

Technical Problem

Incidentally, it is important in the electronic color-chart device that spectra of the colors displayed as the color charts are close to target spectra of the color charts so that original functions of the electronic color-chart device are provided. However, it is found from a simulation described below that the electronic color-chart device in PTL 1 has large errors between the spectra of colors displayed as the color charts and the target spectra.

FIG. 29 represents the spectral characteristics of the LEDs used in PTL 1 (indicated by thin solid lines) together with the target spectrum of "white" of No. 19 in the Macbeth chart under a D65 light source (indicated by a bold solid line) and the display spectrum that is obtained when the color chart that corresponds to "white" by using the LEDs (a bold broken line). As described above, it may be seen that the electronic color-chart device in PTL 1 has a large error between the spectrum of "white" as the target and the spectrum of "white" that is actually displayed as the color chart. By the way, the correlation coefficient that represents the similarity between both of the spectra in this case was a low value of 0.60. Details of the correlation coefficient will be described in a following description of an embodiment.

A reason why the error between both of the spectra as described above may be that the interval between the peak wavelength of the LED that emits green light and the peak wavelength of the LED that emits green-yellow light is too wide and luminance at intermediate wavelengths between those (for example, around 555 nm) significantly lowers in FIG. 29.

Thus, in order to reduce the error between the spectrum of "white" displayed as the color chart and the target spectrum in the electronic color-chart device that uses plural LEDs, it is desired that the plural LEDs including ones with which full wavelength widths at half maximum are narrow and wide are appropriately selected and used so that the intensity that tends to lower around a wavelength of 555 nm may be supplemented.

The LEDs which have the peak wavelength around 555 nm and the narrow full wavelength width at half maximum of 40 nm or narrower are only the ones with low luminous efficacy in reality. Thus, even if the above LEDs are used, avoidance of a lowered intensity around 555 nm and reduction in the error between the spectrum of "white" displayed as the color chart and the target spectrum may not be achieved.

The present invention has been made to solve the above problems, and an object thereof is to provide an electronic color-chart device that may supplement an intensity that tends to lower around a wavelength of 555 nm and may thereby reduce an error between a display spectrum and a target spectrum in a case where "white" is displayed as a color chart.

Solution to Problem

The electronic color-chart device of the present invention is an electronic color-chart device that includes plural LEDs with different peak wavelengths and displays images to serve as color references as color charts by making the plural LEDs emit light, in which in a case where a light emission intensity distribution of each of the plural LEDs is normalized with a maximum intensity being a value of 1, the plural LEDs include plural first LEDs of which at least one is an LED whose full wavelength width at half maximum intensity is 40 nm or narrower and between which a peak interval is 50 nm or narrower and a second LED whose light emission intensity at a wavelength of 555 nm is 0.4 or higher and whose full wavelength width at half maximum intensity is wider than 40 nm.

Advantageous Effects of Invention

The present invention allows an intensity that tends to lower around a wavelength of 555 nm to be supplemented by a second LED when "white" as a color chart is displayed by making plural LEDs emit light and enables reduction in an error between an obtained display spectrum and an idealistic target spectrum as the color chart.

DESCRIPTION OF EMBODIMENTS

One embodiment of the present invention will hereinafter be described based on drawings.

(Configuration of Electronic Color-Chart Device)

Figure 1:
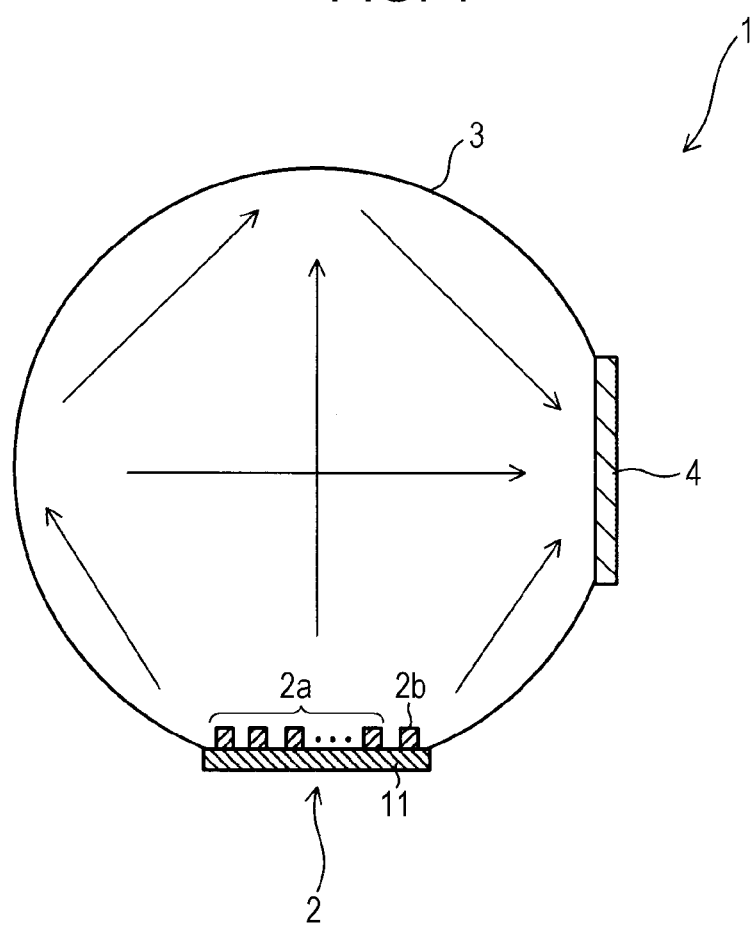
FIG. 1 is a cross-sectional view that illustrates a schematic configuration of an electronic color-chart device of one embodiment of the present invention.

FIG. 1 is a cross-sectional view that illustrates a schematic configuration of an electronic color-chart device of this embodiment. An electronic color-chart device 1 of this embodiment makes plural LEDs emit light to display images that serve as color references as color charts and includes a light source portion 2 that has the plural LEDs, an integrating sphere 3, and a display portion 4.

The integrating sphere 3 has an internal portion that is formed in a hollow spherical shape, diffuses and homogenizes light emitted by the LEDs of the light source portion 2 by reflection on an internal surface, mixes colors of the light (mixing), and guides the light to the display portion 4. The light from the light source portion 2 may be guided to the display portion 4 by using a tubular light guiding member whose internal portion is covered by a reflection surface instead of the integrating sphere 3.

The display portion 4 is configured with a diffusing plate that diffuses the light that is emitted by the plural LEDs and incident via the integrating sphere 3 and functions as a screen that displays the color chart that serves as the color reference by diffusing the light by the diffusing plate. The light source portion 2 and the display portion 4 are provided in respective opening portions that open at portions of the integrating sphere 3.

The light source portion 2 includes plural first LEDs 2a and a second LED 2b as plural LEDs with different peak wavelengths on a substrate 11. Light emission of the LEDs is controlled by a light emission control portion that is not illustrated. Values of current applied to the LEDs and duty ratios are controlled in accordance with the displayed color chart.

(Details of Light Source Portion)

Figure 2:
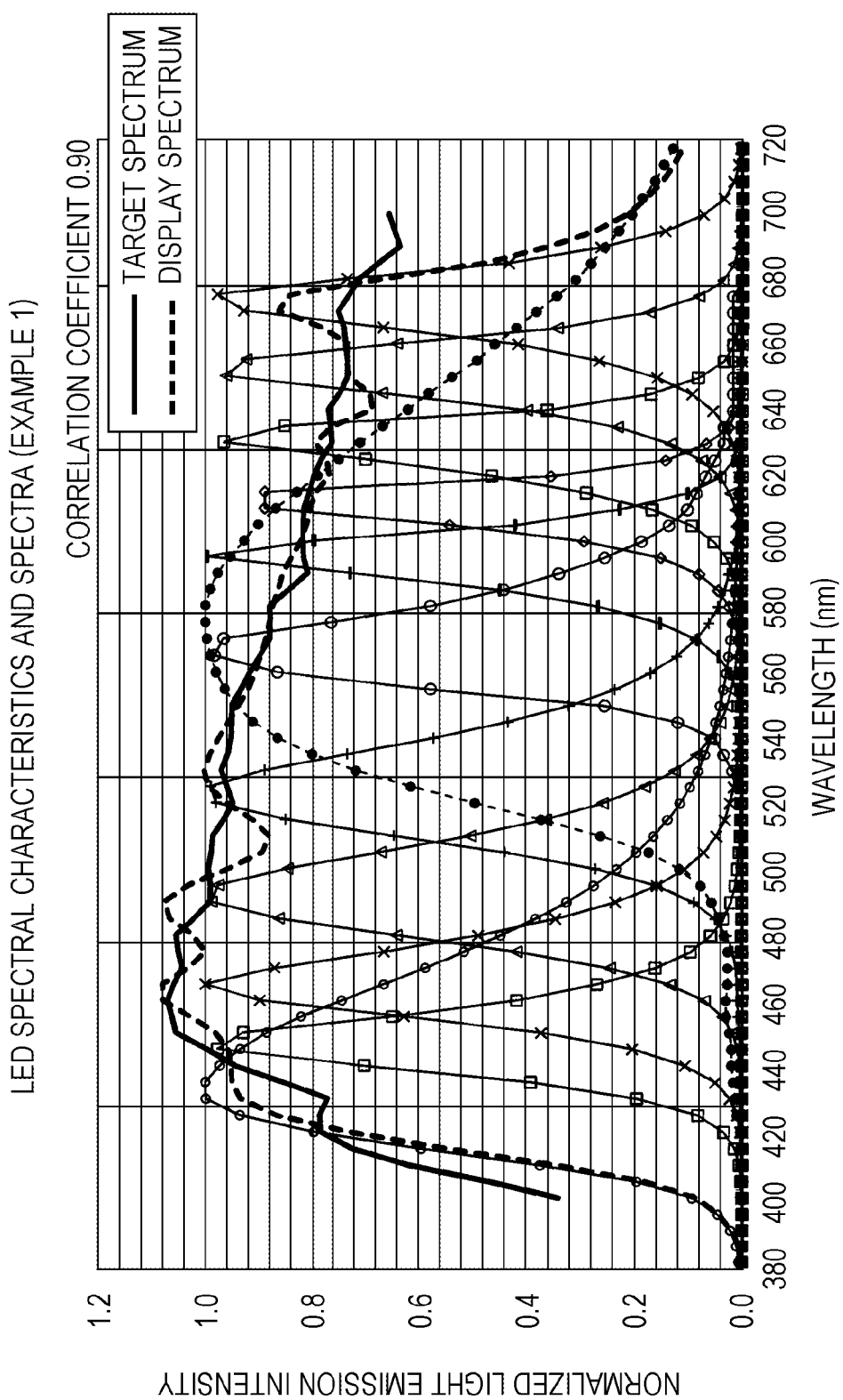
FIG. 2 is a graph that represents spectral characteristics of plural LEDs that are provided in the electronic color-chart device and represents a target spectrum and a display spectrum in example 1.

FIG. 2 represents light emission intensity distributions (light emission characteristics and spectral characteristics) of the plural LEDs of the light source portion 2. In FIG. 2, the light emission intensity distributions of the plural LEDs are normalized with the maximum intensity being a value of 1. Hereinafter, the intensity indicates an intensity in the normalized light emission intensity distribution, and a half-intensity width indicates a full wavelength width at half maximum intensity.

In FIG. 2, the spectral characteristics of the plural first LEDs 2a are represented by thin solid lines, and the spectral characteristic of the second LED 2b is represented by a thin broken line (plot points by black circle marks). The peak wavelengths of the plural first LEDs 2a are 435 nm, 448 nm, 465 nm, 493 nm, 524 nm, 567 nm, 596 nm, 613 nm, 632 nm, 653 nm, and 673 nm (11 LEDs in total), and all peak intervals are 50 nm or shorter. The half-intensity widths of the plural first LEDs 2a are 61 nm, 20.5 nm, 26.2 nm, 33.3 nm, 35.5 nm, 29.5 nm, 18 nm, 14 nm, 17 nm, 19 nm, and 21.5 nm, and all the half-intensity widths are 40 nm or shorter, except the first LED 2a with the peak wavelength of 435 nm.

Meanwhile, the peak wavelength of the second LED 2b is 574 nm and is positioned on the long wavelength side with respect to 555 nm. Further, the half-intensity width of the second LED 2b is 134 nm, and the light emission intensity at a wavelength of 555 nm is 0.96.

Figure 3:
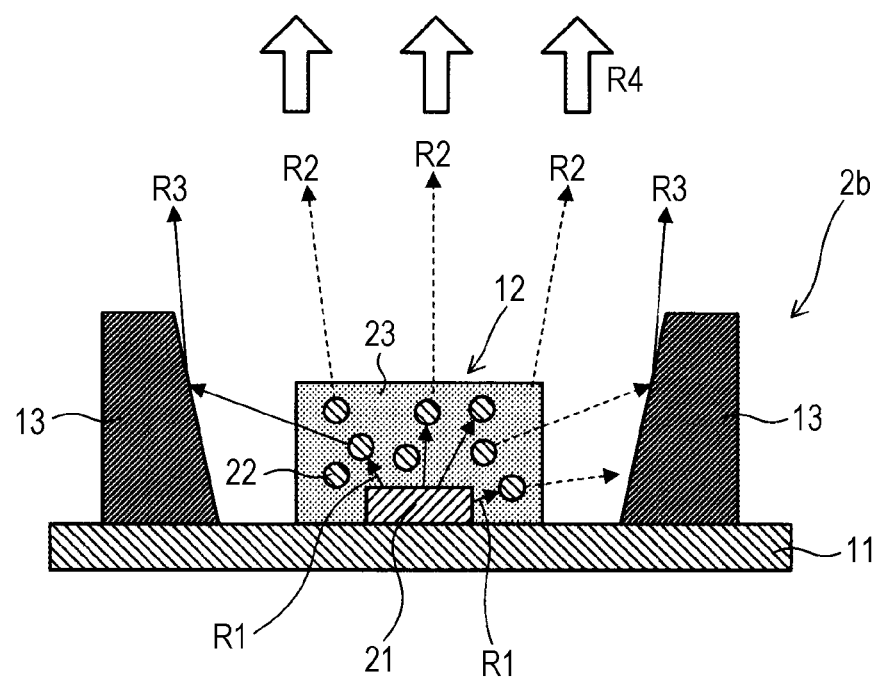
FIG. 3 is a cross-sectional view that illustrates a schematic configuration of a second LED that is included in the plural LEDs.

FIG. 3 is a cross-sectional view that illustrates a schematic configuration of the second LED 2b. The second LED 2b is configured to have a light emission portion 12 and a reflector 13 on the substrate 11. The reflector 13 reflects light emitted by the light emission portion 12 in a desired direction.

The light emission portion 12 is configured to have a LED chip 21 that emits light, a phosphor 22 that receives the light emitted by the LED chip 21 and emits fluorescence, and a sealing resin 23 for sealing those. The LED chip 21 is configured with indium gallium nitride (InGaN), for example, and emits blue light. The phosphor 22 is configured with an yttrium aluminum garnet (YAG) ($Y_3AL_5O_{12}$:Ce) phosphor and is excited by the blue light emitted from the LED chip 21 to emit yellow light.

In such a configuration of the second LED 2b, first light R1 emitted by the LED chip 21, second light R2 that the phosphor 22 is excited by the light R1 to emit, third light R3 that is reflection light of the first light R1 or the second light R2 and emitted by the reflector 3 are synthesized and emitted from the second LED 2b as synthetic light R4.

In this embodiment, the phosphor 22 thickly covers the LED chip 21, and light that is directly emitted from the LED chip 21 to the outside is thereby reduced. However, the light emission portion 12 is not limited to such a configuration. It may easily be speculated that the light that is directly emitted from the LED chip 21 to the outside is reduced based on the fact that a slight light emission spectrum is present around a wavelength of 460 nm in the light emission characteristic of the second LED 2b in FIG. 2.

As described above, the second LED 2b is configured to include the phosphor 22, and the phosphor 22 thereby emits light with a wide wavelength width. Thus, as illustrated in FIG. 2, the second LED 2b that has a broad light emission characteristic with the half-intensity width of wider than 40 nm may certainly be realized.

The first LED 2a has no phosphor, and the half-intensity width of the first LED 2a is thus narrower than the second LED 2b. A structure of the first LED 2a almost corresponds to a structure in which the phosphor 22 in FIG. 3 is removed and the LED chip 21 is substituted by an LED chip that emits light with a prescribed wavelength.

(Correlation Coefficient)

Next, in this embodiment, the correlation coefficient that is used in determination about similarity between spectra will first be described. A correlation coefficient is a scale that indicates the strength of a linear association (degree of similarity) between x and y when two variables are x and y. For a sample of a size n, given that results of examinations of the two variables x and y are $(x_1, y_1), (x_2, y_2), \ldots, (x_n, y_n)$ and the correlation coefficient is r, r is expressed by the following equation. In the following equation, a symbol that has a bar added above x represents the arithmetic mean of $x_1, x_2, \ldots, x_n$, and a symbol that has a bar added above y represents the arithmetic mean of $y_1, y_2, \ldots, y_n$.

$$r = \frac{(x_1 - \bar{x})(y_1 - \bar{y}) + \ldots + (x_n - \bar{x})(y_n - \bar{y})}{\sqrt{(x_1 - \bar{x})^2 + \ldots + (x_n - \bar{x})^2} \sqrt{(y_1 - \bar{y})^2 + \ldots + (y_n - \bar{y})^2}} \quad \text{[Math. 1]}$$

The correlation coefficient r takes actual measurement values between −1 and 1. It is considered that the correlation coefficient r that is closer to 1 indicates a more positive correlation between the two variables x and y and the correlation coefficient r that is closer to −1 indicates a more negative correlation between the two variables x and y. A positive correlation is a relationship in which when the value of one variable increases, the value of the other also increases. A negative correlation is a relationship in which when the value of one variable increases, the value of the other decreases. In this embodiment, the correlation coefficient r that is closer to 1 indicates that the spectrum of the displayed color is closer to the target (idealistic) spectrum as the color chart. In this embodiment, it is considered that the correlation coefficient r=0.85 is the minimum necessary value and 0.95 or higher is an idealistic value.

EXAMPLES

Hereinafter, specific examples of the spectra that are obtained by the electronic color-chart device 1 of this embodiment will be described as examples. Further, comparative examples will also be described for comparison with the examples. Hereinafter, a description will be made about the spectra that are obtained when the plural LEDs are made emit light to display "white" of No. 19 in the Macbeth chart under a D65 light source as the color chart (hereinafter, also denoted as "white" as the color chart). For convenience of description, the ideal spectrum of "white" as the color chart will be referred to as target spectrum, and the spectrum of the color chart of "white" that are actually displayed on the display portion 4 will be referred to as display spectrum.

Example 1

In example 1, when the "white" as the color chart was displayed, the second LED 2b was made emit light in addition to the 11 first LEDs 2a. As a result, as illustrated in FIG. 2, the display spectrum that was close to the target spectrum was obtained. The correlation coefficient was a high value of 0.90.

Example 2

Figure 4:
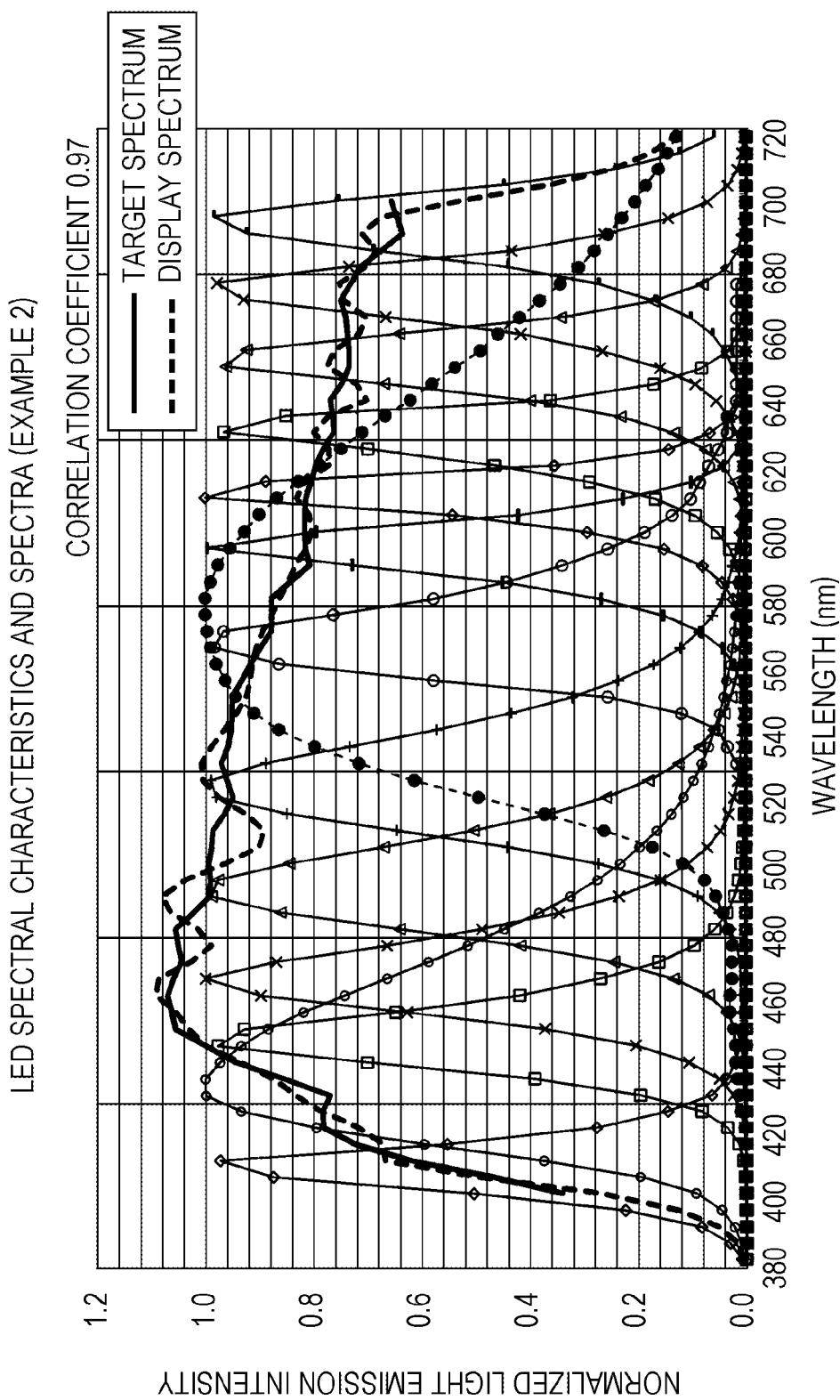
FIG. 4 is a graph that represents the spectral characteristics of the plural LEDs, the target spectrum, and the display spectrum in example 2.

FIG. 4 represents the spectral characteristics of the plural LEDs, the target spectrum (bold solid line), and the display spectrum (bold broken line) in example 2 in combination. In example 2, the plural first LED 2a were configured with further 2 LEDs in addition to the 11 LEDs in example 1. The peak wavelengths of the added LEDs were 408 nm and 693 nm, and the half-intensity widths were 16 nm and 20.5 nm. When the "white" as the color chart was displayed, the 13 first LEDs 2a in total and the second LED 2b were made emit light. The two LEDs added as the first LEDs 2a may be the ones with peak wavelengths within a range of 680 nm to 720 nm and a range of 380 nm to 420 nm.

In example 2, the intensities around wavelengths of 400 nm and 700 nm could be supplemented by the two LEDs added as the first LED 2a. Thus, the display spectrum further approached the target spectrum, and the correlation coefficient of an ideal value of 0.97 was obtained.

Example 3

Figure 5:
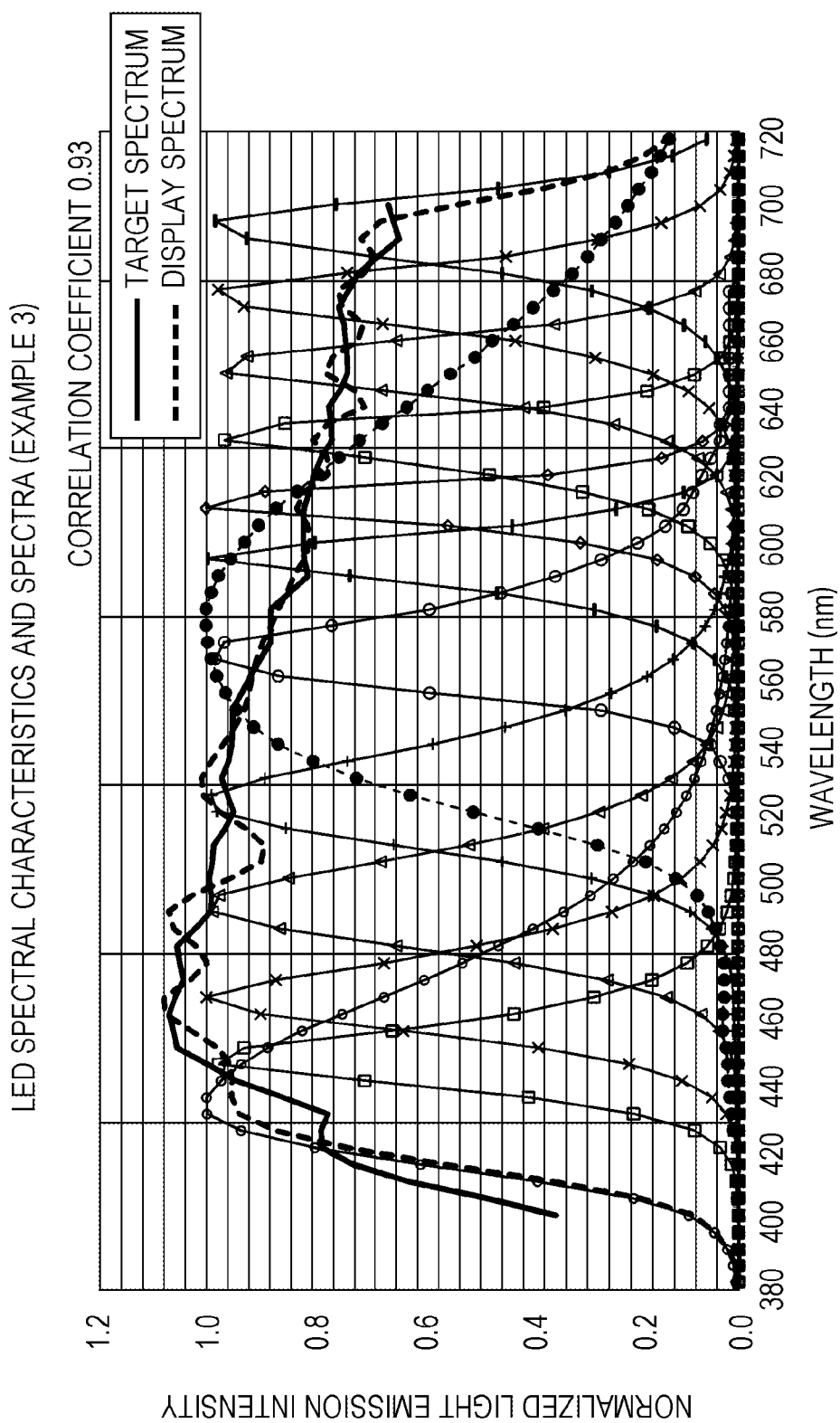
FIG. 5 is a graph that represents the spectral characteristics of the plural LEDs, the target spectrum, and the display spectrum in example 3.

FIG. 5 represents the spectral characteristics of the plural LEDs, the target spectrum (bold solid line), and the display spectrum (bold broken line) in example 3 in combination. In example 3, when the "white" as the color chart was displayed, the 11 LEDs same as example 1 among the plural first LEDs 2a of example 2 and the LED with the peak wavelength of 693 nm were made emit light, and the second LED 2b was made emit light. That is, the LED with the peak wavelength of 408 nm among the plural first LEDs 2a was not made emit light.

In example 3, because the LED with the peak wavelength of 408 nm was not made emit light, only the intensity around a wavelength of 700 nm could be supplemented with respect to the spectrum of example 1. However, the correlation coefficient of a high value of 0.93 was obtained, and a better result than example 1 was obtained.

Example 4

Figure 6:
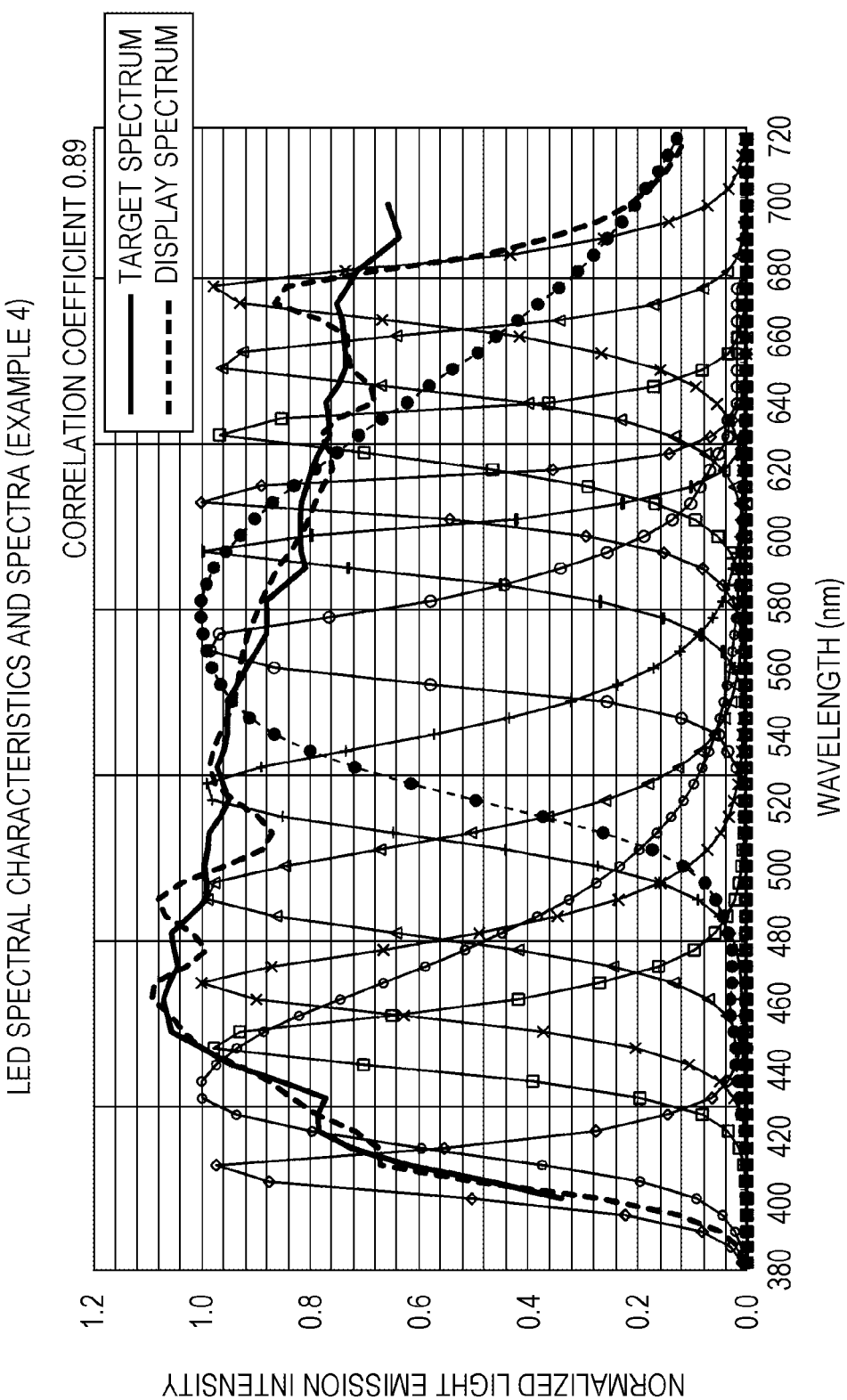
FIG. 6 is a graph that represents the spectral characteristics of the plural LEDs, the target spectrum, and the display spectrum in example 4.

FIG. 6 represents the spectral characteristics of the plural LEDs, the target spectrum (bold solid line), and the display spectrum (bold broken line) in example 4 in combination. In example 4, when the "white" as the color chart was displayed, the 11 LEDs same as example 1 among the plural first LEDs 2a of example 2 and the LED with the peak wavelength of 408 nm were made emit light, and the second LED 2b was made emit light. That is, the LED with the peak wavelength of 693 nm among the plural first LEDs 2a was not made emit light.

In example 4, because the LED with the peak wavelength of 693 nm was not made emit light, only the intensity around a wavelength of 400 nm could be supplemented with respect to the spectrum of example 1. However, the correlation coefficient of a high value of 0.89 was obtained, and a result close to example 1 was obtained.

In a case where the additional two LEDs are not made emit light, the slope around a wavelength of 700 nm of the display spectrum is mild compared to the slope around a wavelength of 400 nm. Thus, the degree of influence of the additional LEDs on the display spectrum is higher around a wavelength of 700 nm than around a wavelength of 400 nm. Therefore, in a case where either one of the LED with the peak wavelength of 408 nm and the LED with the peak wavelength of 693 nm is made emit light, making the LED with the peak wavelength of 693 nm emit light provides an effect of increasing the correlation coefficient compared to a case of making the LED with the peak wavelength of 408 nm emit light.

Example 5

Figure 7:
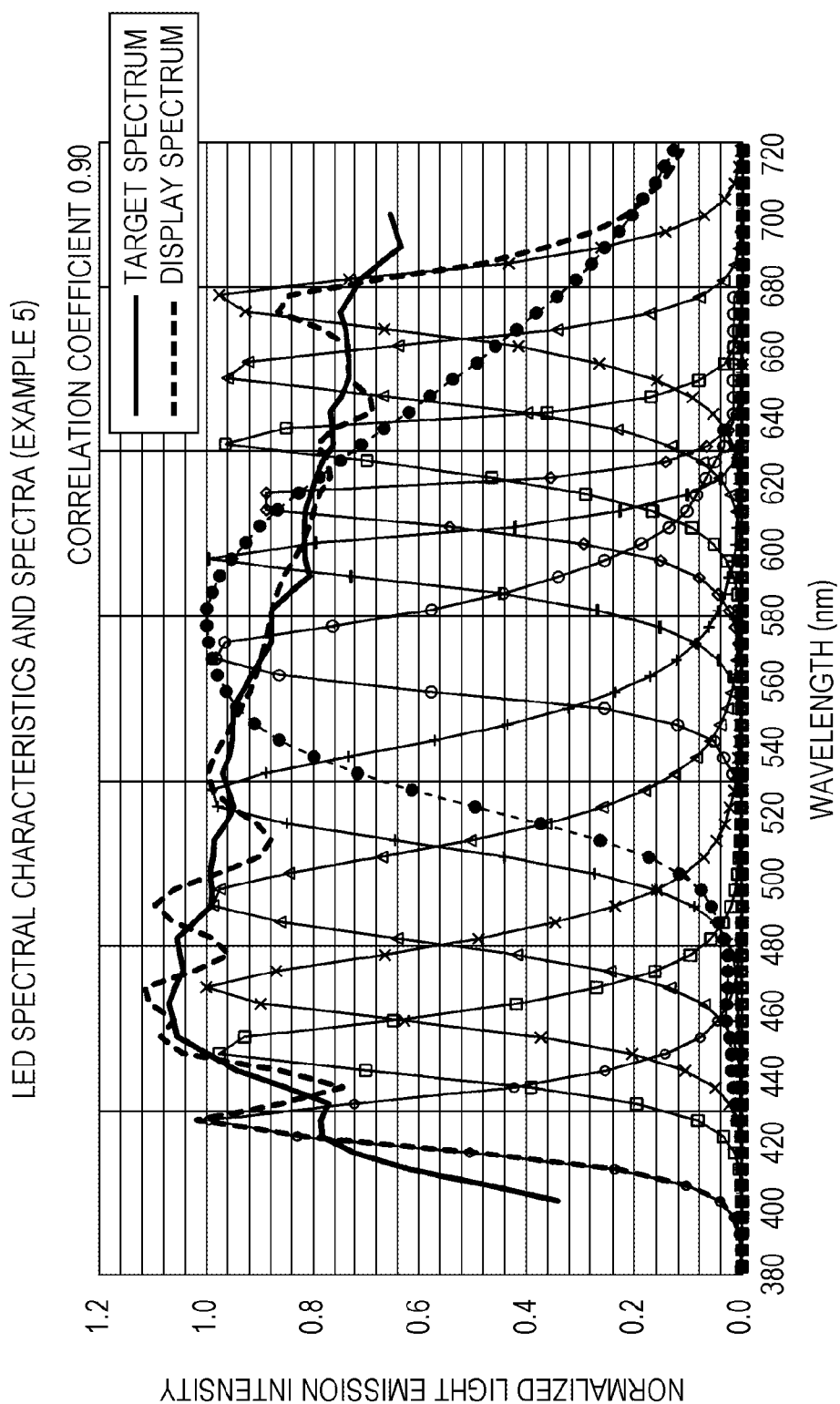
FIG. 7 is a graph that represents the spectral characteristics of the plural LEDs, the target spectrum, and the display spectrum in example 5.

FIG. 7 represents the spectral characteristics of the plural LEDs, the target spectrum (bold solid line), and the display spectrum (bold broken line) in example 5 in combination. In example 5, the LED with the peak wavelength of 435 nm and the half-intensity width of 61 nm was substituted by an LED with the peak wavelength of 435 nm and the half-intensity width of 21 nm in the plural first LEDs 2a of example 1. Further, when the "white" as the color chart was displayed, the 11 LEDs in total as the plural first LEDs 2a were made emit light, and the second LED 2b was made emit light.

In example 5, all the half-intensity widths of the plural first LEDs 2a were 40 nm or narrower. However, the correlation coefficient was 0.90, which was equivalent to example 1. It is considered that the half-intensity width of the LED with the peak wavelength 435 nm does not largely influence the correlation coefficient.

Example 6

Figure 8:
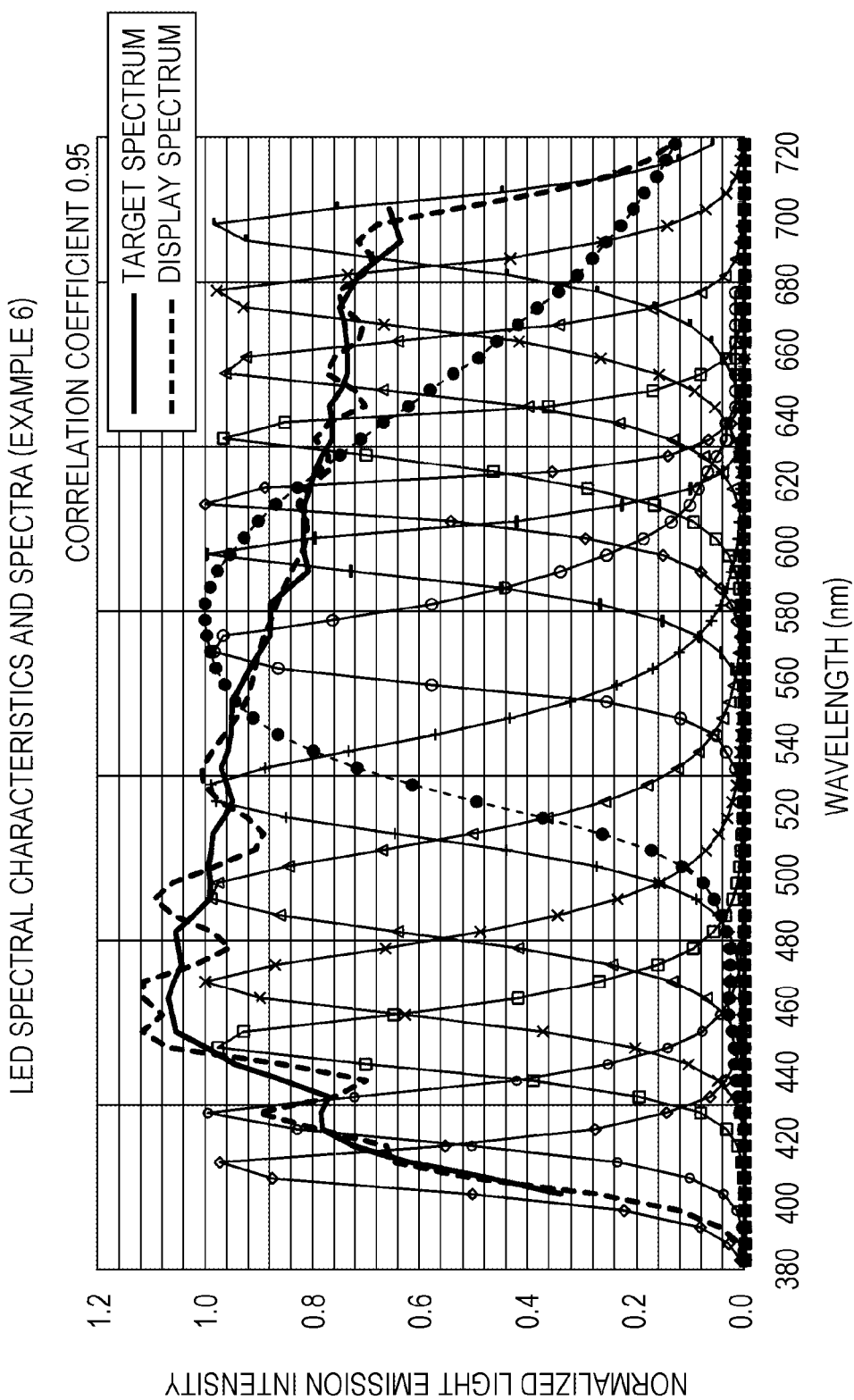
FIG. 8 is a graph that represents the spectral characteristics of the plural LEDs, the target spectrum, and the display spectrum in example 6.

FIG. 8 represents the spectral characteristics of the plural LEDs, the target spectrum (bold solid line), and the display spectrum (bold broken line) in example 6 in combination. In example 6, the LED with the peak wavelength of 435 nm and the half-intensity width of 61 nm was substituted by the LED with the peak wavelength of 435 nm and the half-intensity width of 21 nm in the plural first LEDs 2a of example 2. Further, when the "white" as the color chart was displayed, the 13 LEDs in total as the plural first LEDs 2a were made emit light, and the second LED 2b was made emit light.

In example 6, the correlation coefficient was 0.95, which was slightly lower than 0.97 of example 2. However, it may still be considered that an ideal correlation coefficient was obtained.

Comparative Example 1

Figure 9:
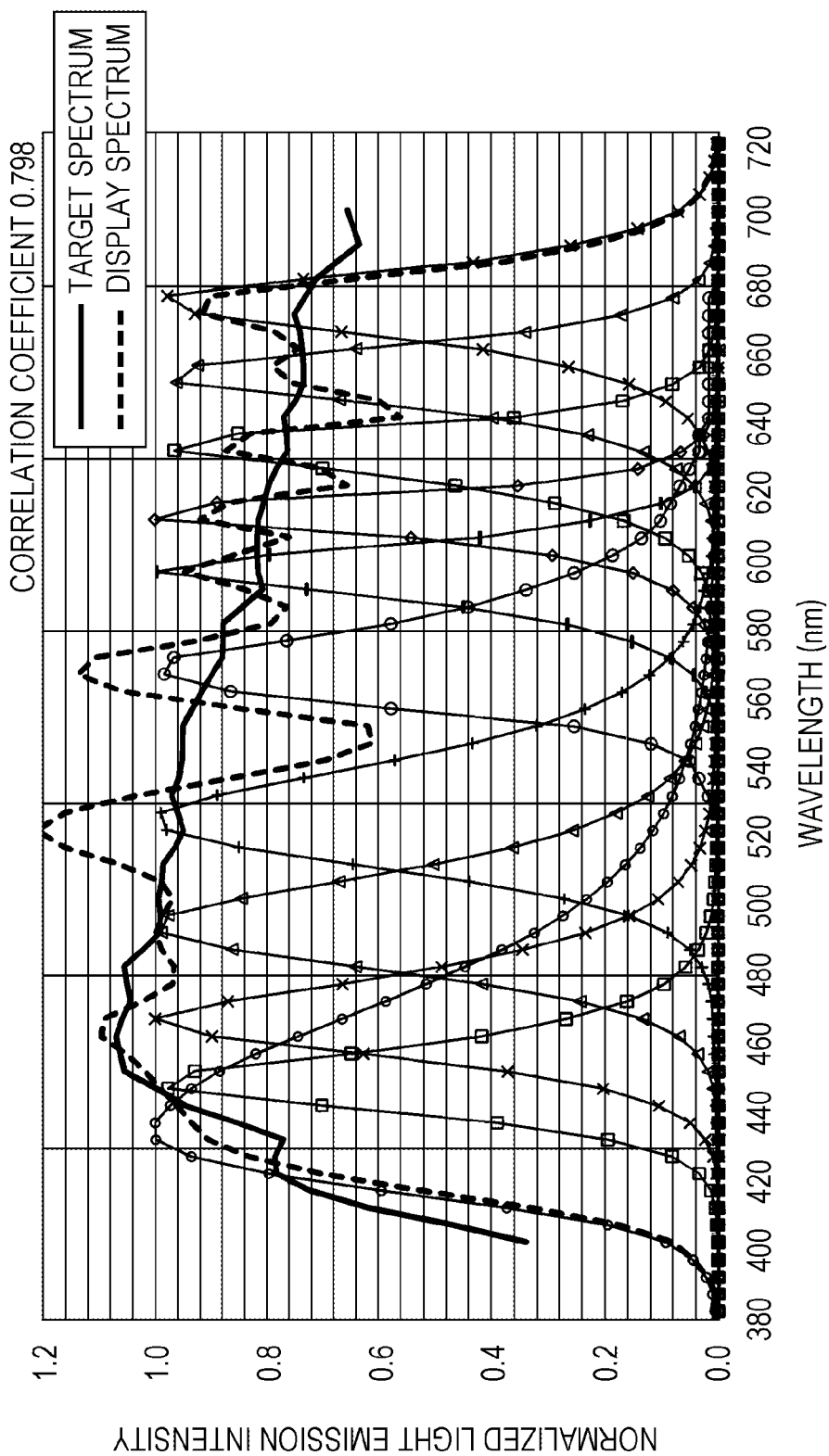
FIG. 9 is a graph that represents the spectral characteristics of the plural LEDs, the target spectrum, and the display spectrum in comparative example 1.

FIG. 9 represents the spectral characteristics of plural LEDs, the target spectrum (bold solid line), and the display spectrum (bold broken line) in comparative example 1 in combination. In comparative example 1, when the "white" as the color chart was displayed, the second LED 2b was not made emit light, and the 11 LEDs as the plural first LEDs 2a were made emit light, similarly to example 1.

In comparative example 1, because the intensity around a wavelength of 555 nm lowered, the display spectrum became winding, the error from the target spectrum was large, and the correlation coefficient was a low value of 0.798.

Comparative Example 2

Figure 10:
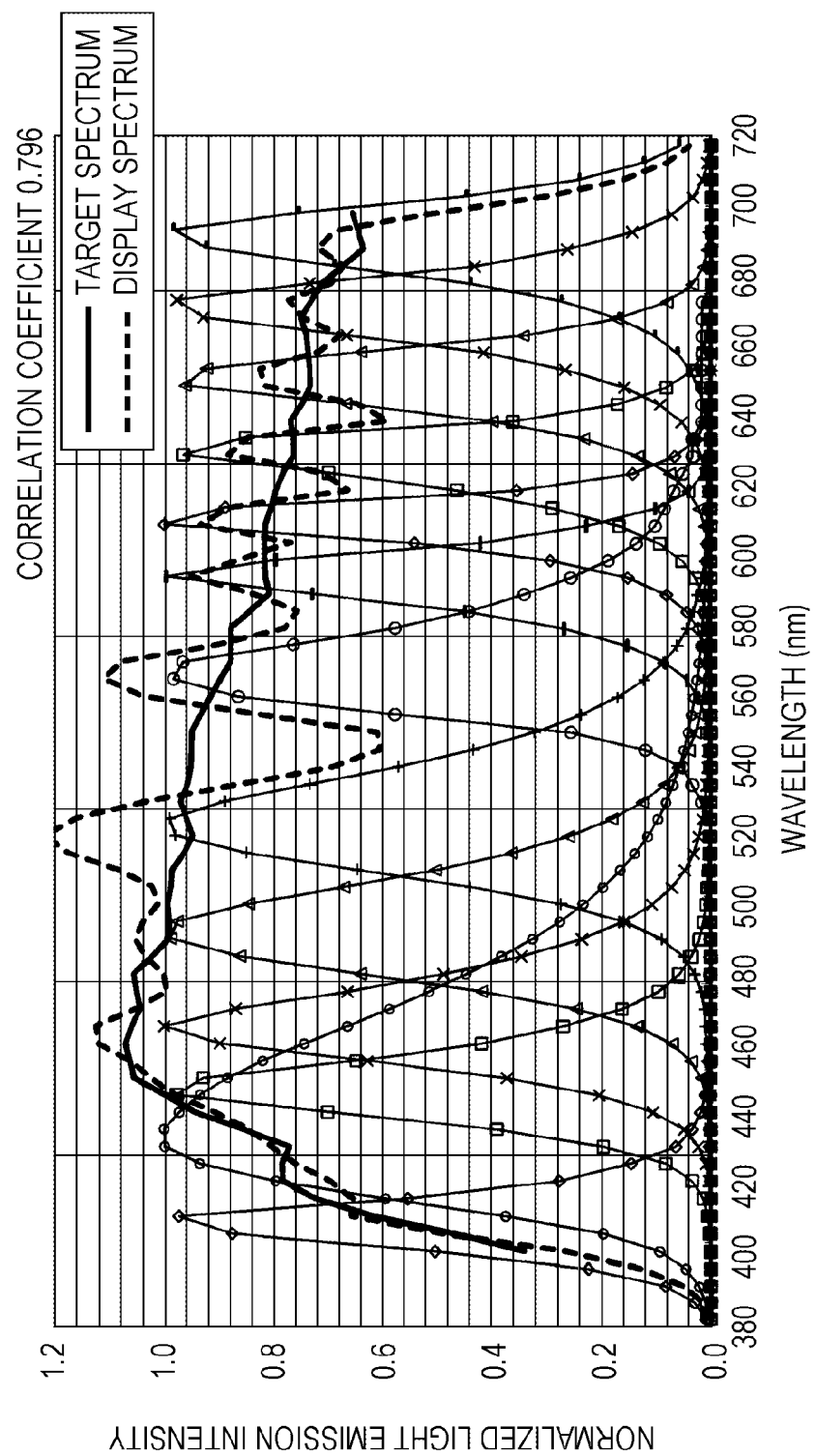
FIG. 10 is a graph that represents the spectral characteristics of the plural LEDs, the target spectrum, and the display spectrum in comparative example 2.

FIG. 10 represents the spectral characteristics of the plural LEDs, the target spectrum (bold solid line), and the display spectrum (bold broken line) in comparative example 2 in combination. In comparative example 2, the 13 LEDs were used as the plural first LEDs 2a, similarly to example 2. Further, when the "white" as the color chart was displayed, the second LED 2b was not made emit light, and the plural first LEDs 2a (13 LEDs in total) were made emit light.

In comparative example 2 also, the correlation coefficient was as low as 0.796. The result was almost the same as comparative example 1.

Comparative Example 3

Figure 11:
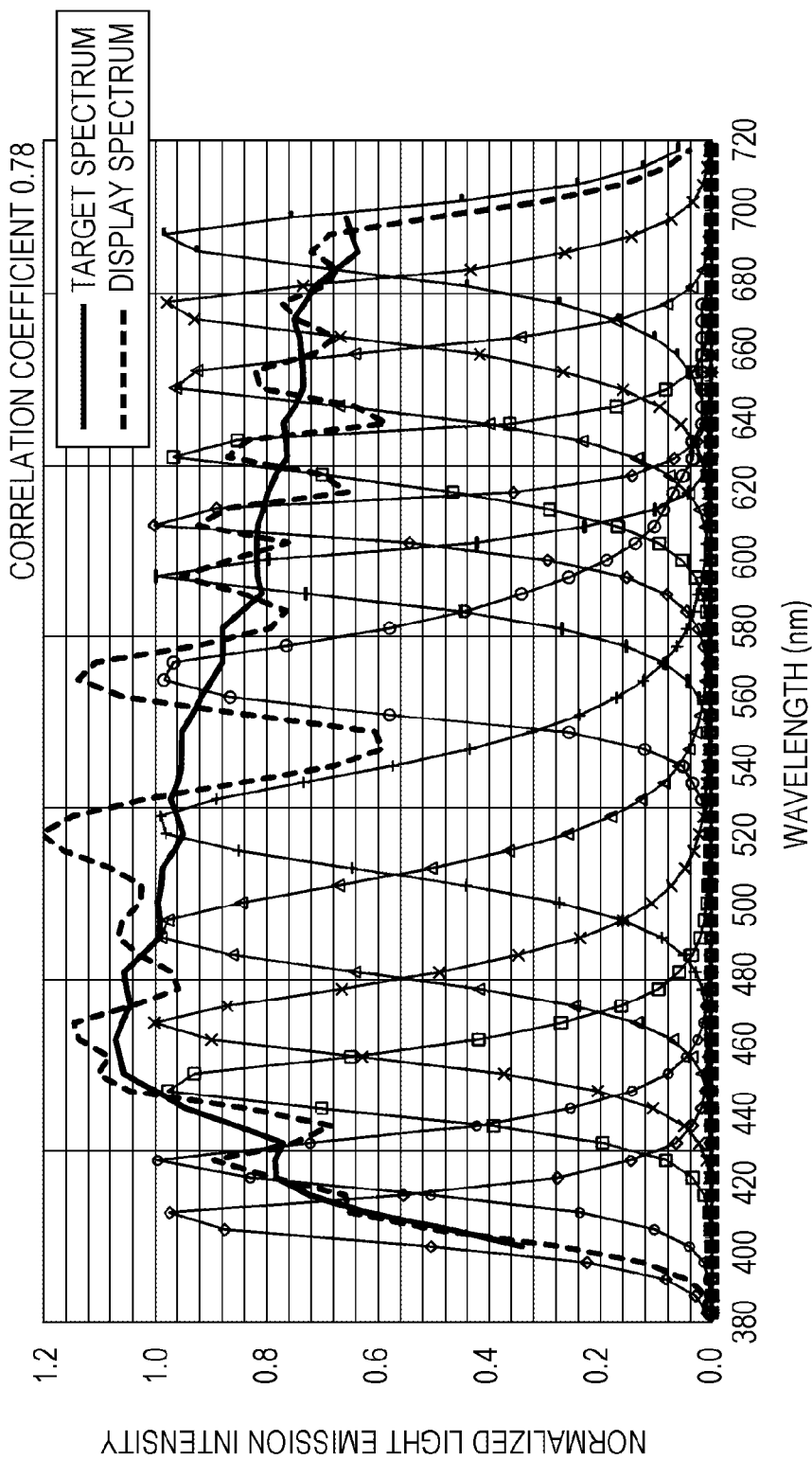
FIG. 11 is a graph that represents the spectral characteristics of the plural LEDs, the target spectrum, and the display spectrum in comparative example 3.

FIG. 11 represents the spectral characteristics of the plural LEDs, the target spectrum (bold solid line), and the display spectrum (bold broken line) in comparative example 3 in combination. In comparative example 3, the LED with the peak wavelength of 435 nm and the half-intensity width of 61 nm was substituted by the LED with the peak wavelength of 435 nm and the half-intensity width of 21 nm in the plural first LEDs 2a of comparative example 2. Further, when the "white" as the color chart was displayed, the second LED 2b was not made emit light, and the 13 LEDs in total as the plural first LEDs 2a were made emit light.

In comparative example 3 also, the correlation coefficient was as low as 0.78. The result was almost the same as comparative examples 1 and 2.

Comparative Example 4

Figure 12:
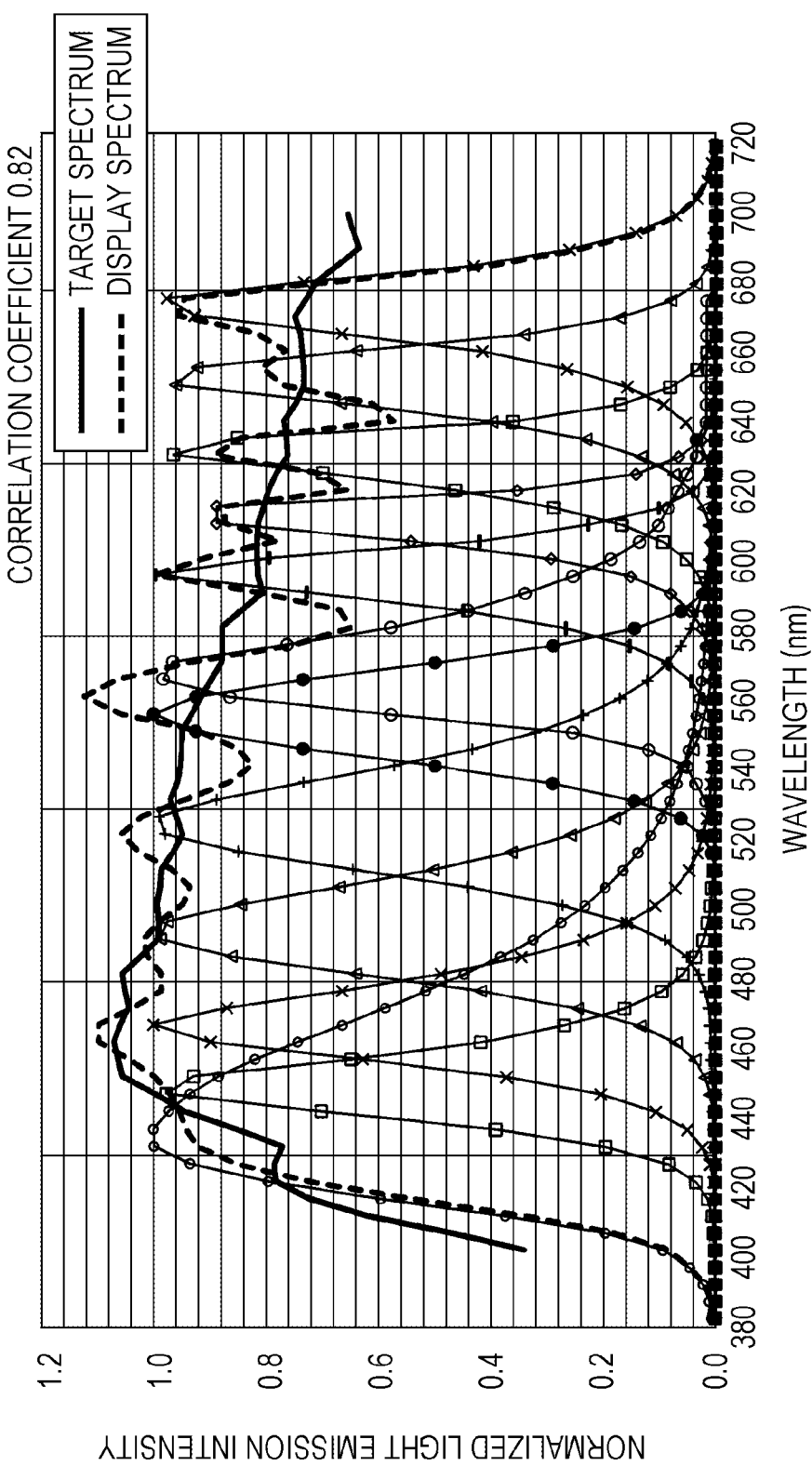
FIG. 12 is a graph that represents the spectral characteristics of the plural LEDs, the target spectrum, and the display spectrum in comparative example 4.

FIG. 12 represents the spectral characteristics of the plural LEDs, the target spectrum (bold solid line), and the display spectrum (bold broken line) in comparative example 4 in combination. In comparative example 4, an LED with the peak wavelength of 555 nm and the half-intensity width of 30 nm was added to the 11 LEDs as the plural first LED 2a, which were the same as example 1. The spectral characteristic of the additional LED is represented by a narrow solid line whose plot points are black circle marks. Further, when the "white" as the color chart was displayed, the second LED 2b was not made emit light, and the 12 LEDs in total as the plural first LEDs 2a were made emit light.

As described above, the LEDs which have the peak wavelength around 555 nm are only the ones with low luminous efficacy in reality. Thus, as in comparative example 4, the correlation coefficient may be increased only to 0.82 even if the above LED is used so as to supplement the intensity around a wavelength of 555 nm. That is, comparative example 4 provides a slight effect of increasing the correlation coefficient compared to comparative example 1. However, an effect of realizing the correlation coefficient of 0.85 or higher may not be obtained.

Example 7

Figure 13:
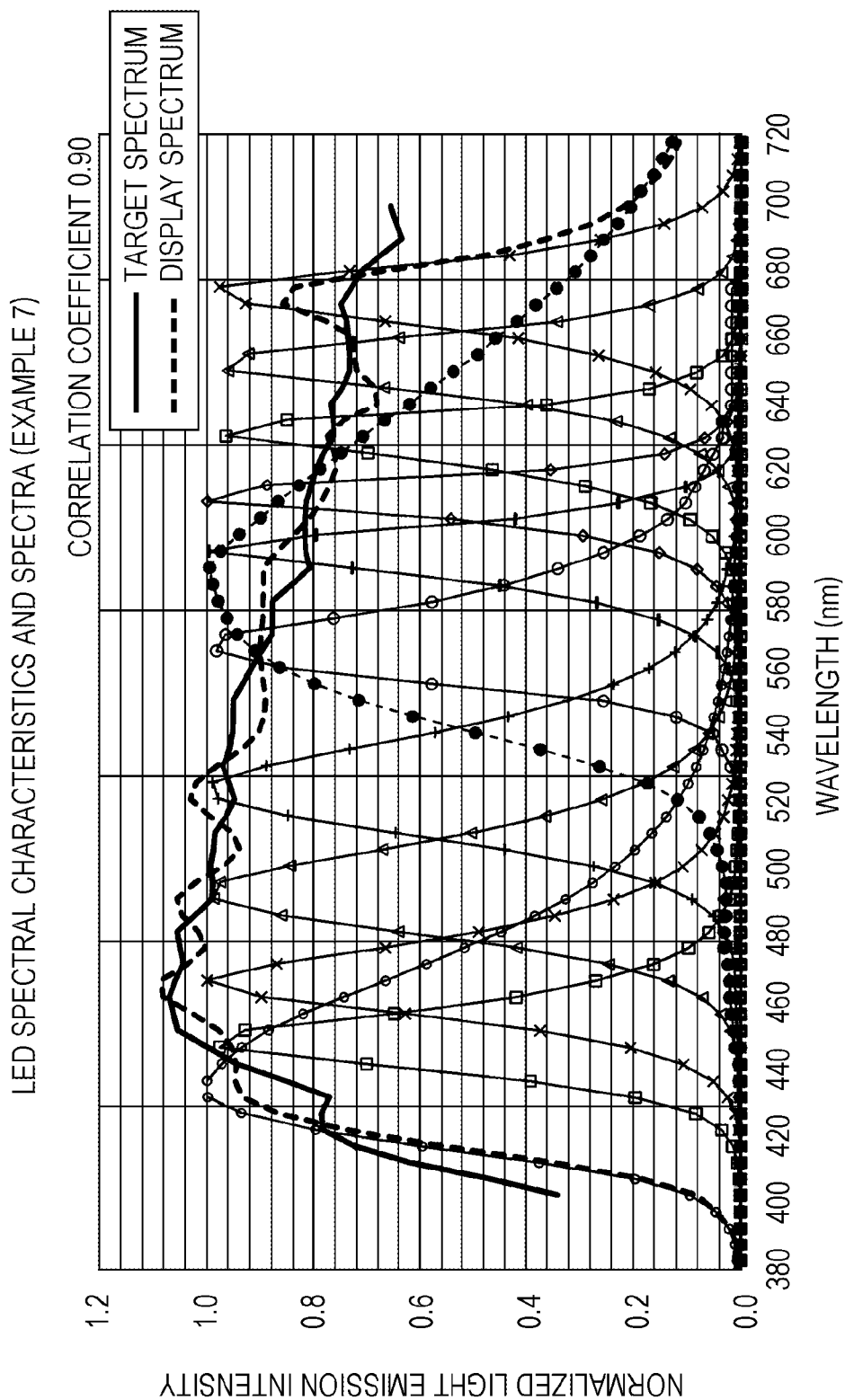
FIG. 13 is a graph that represents the spectral characteristics of the plural LEDs, the target spectrum, and the display spectrum in example 7.

FIG. 13 represents the spectral characteristics of the plural LEDs, the target spectrum (bold solid line), and the display spectrum (bold broken line) in example 7 in combination. In example 7, an LED whose light emission intensity at a wavelength of 555 nm was 0.7 or higher to lower than 0.9 was used as the second LED 2b of example 1. The peak wavelength of the second LED 2b was 590 nm, and the half-intensity width was 125 nm in this case. Further, when the "white" as the color chart was displayed, the plural first LEDs 2a and the second LED 2b were made emit light.

In example 7, the correlation coefficient was 0.90, and a result equivalent to example 1 was obtained.

Example 8

Figure 14:
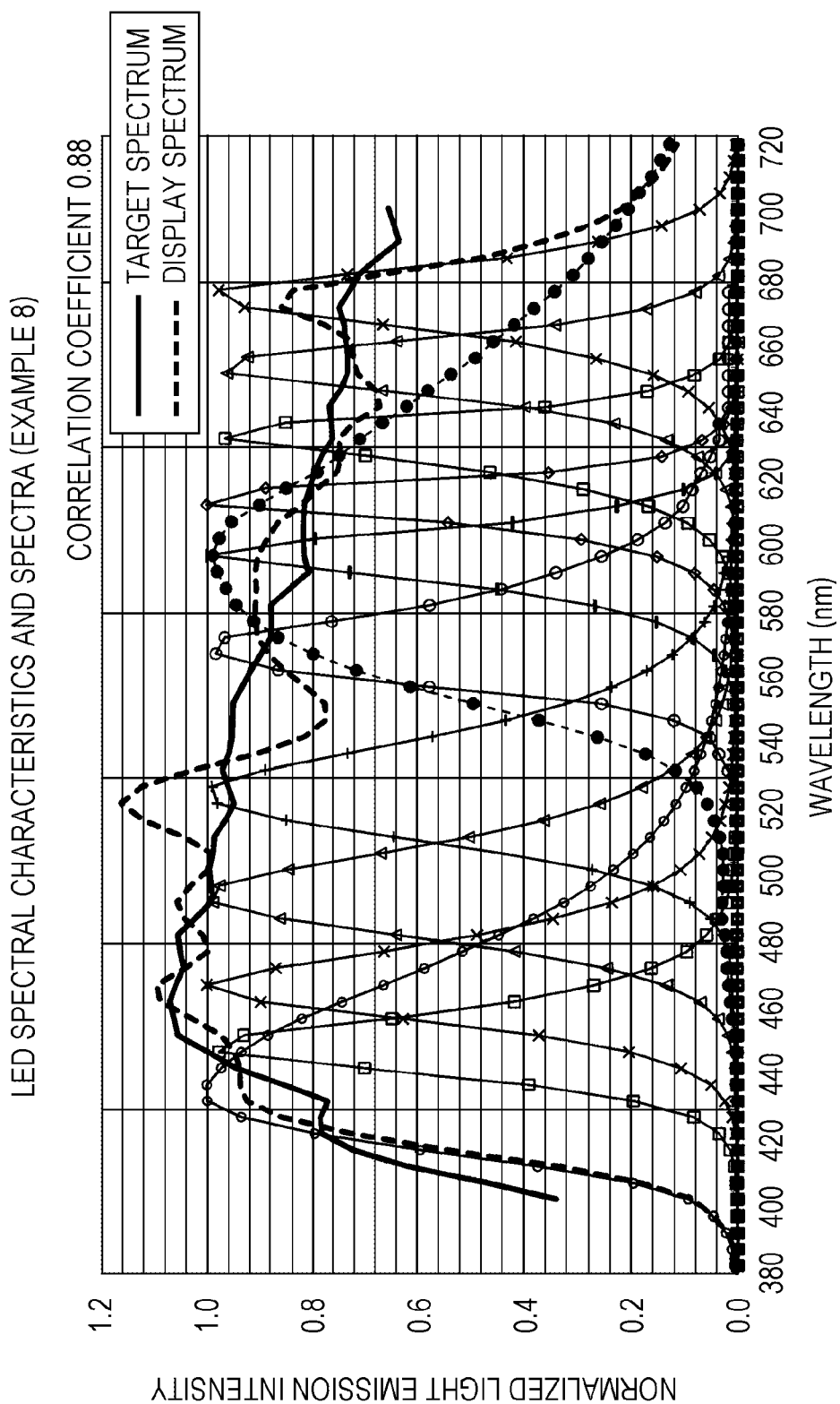
FIG. 14 is a graph that represents the spectral characteristics of the plural LEDs, the target spectrum, and the display spectrum in example 8.

FIG. 14 represents the spectral characteristics of the plural LEDs, the target spectrum (bold solid line), and the display spectrum (bold broken line) in example 8 in combination. In example 8, an LED whose light emission intensity at a wavelength of 555 nm was 0.5 or higher to lower than 0.7 was used as the second LED 2b of example 1. The peak wavelength of the second LED 2b was 595 nm, and the half-intensity width was 105 nm in this case. Further, when the "white" as the color chart was displayed, the plural first LEDs 2a and the second LED 2b were made emit light.

In example 8, the correlation coefficient was 0.88, which was a slightly lower value than example 1. However, it may still be considered that a high correlation coefficient of 0.85 or higher was obtained.

Example 9

Figure 15:
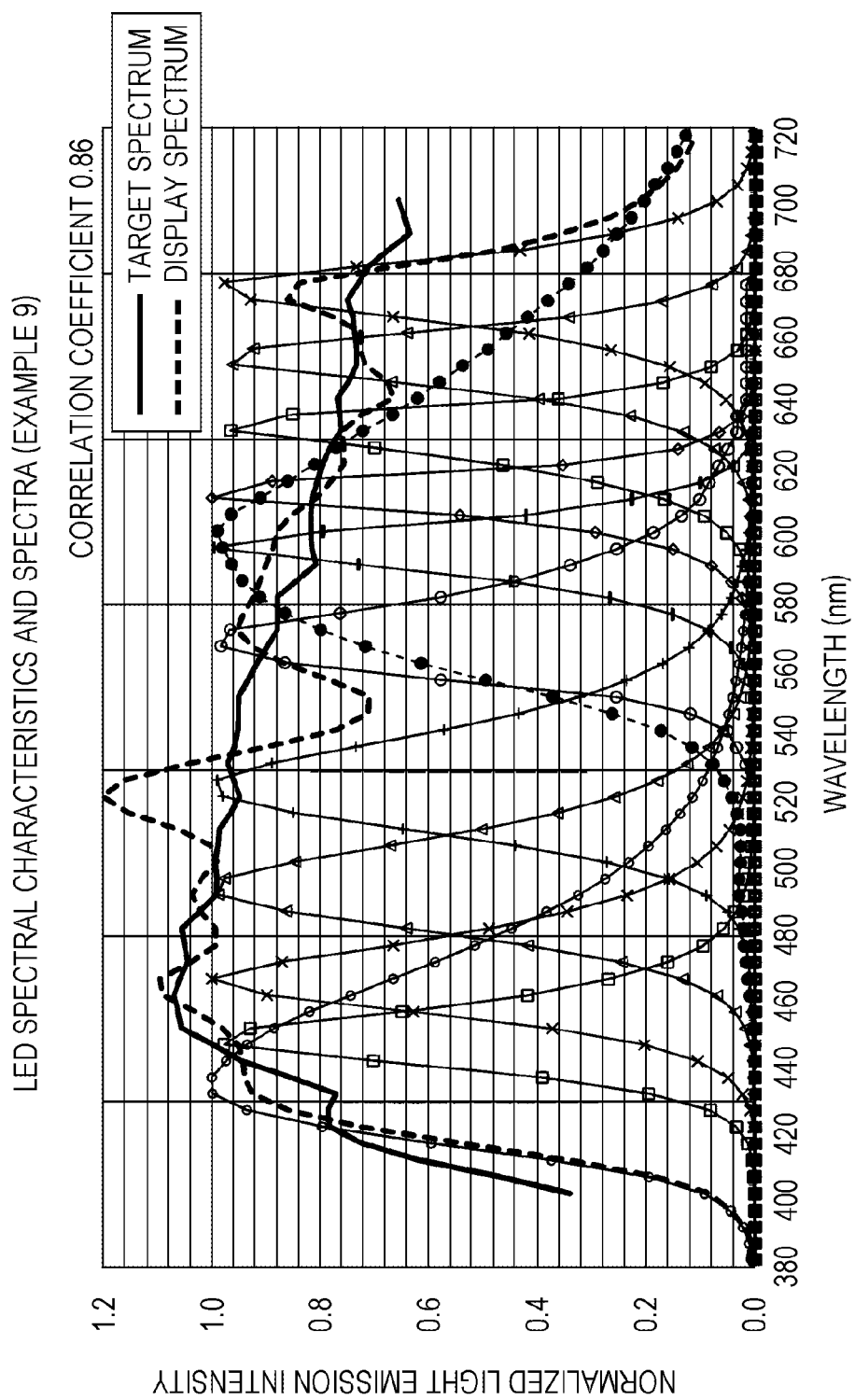
FIG. 15 is a graph that represents the spectral characteristics of the plural LEDs, the target spectrum, and the display spectrum in example 9.

FIG. 15 represents the spectral characteristics of the plural LEDs, the target spectrum (bold solid line), and the display spectrum (bold broken line) in example 9 in combination. In example 9, an LED whose light emission intensity at a wavelength of 555 nm was 0.4 or higher to lower than 0.6 was used as the second LED 2b of example 1. The peak wavelength of the second LED 2b was 595 nm, and the half-intensity width was 100 nm in this case. Further, when the "white" as the color chart was displayed, the plural first LEDs 2a and the second LED 2b were made emit light.

In example 9, the correlation coefficient was 0.86, which was a slightly lower value than example 8. However, it may still be considered that a targeted value of 0.85 or higher was obtained.

Comparative Example 5

Figure 16:
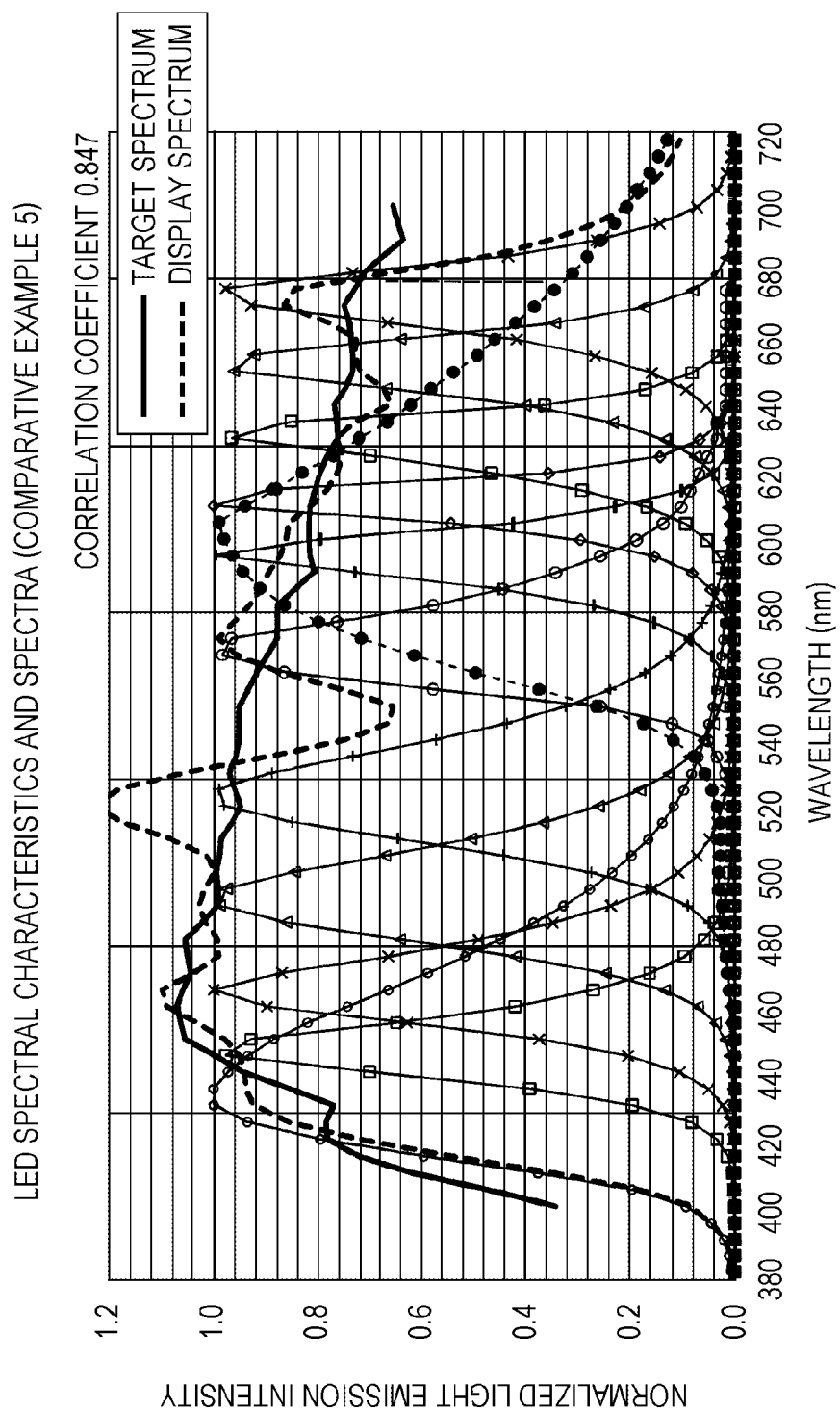
FIG. 16 is a graph that represents the spectral characteristics of the plural LEDs, the target spectrum, and the display spectrum in comparative example 5.
Figure 17:
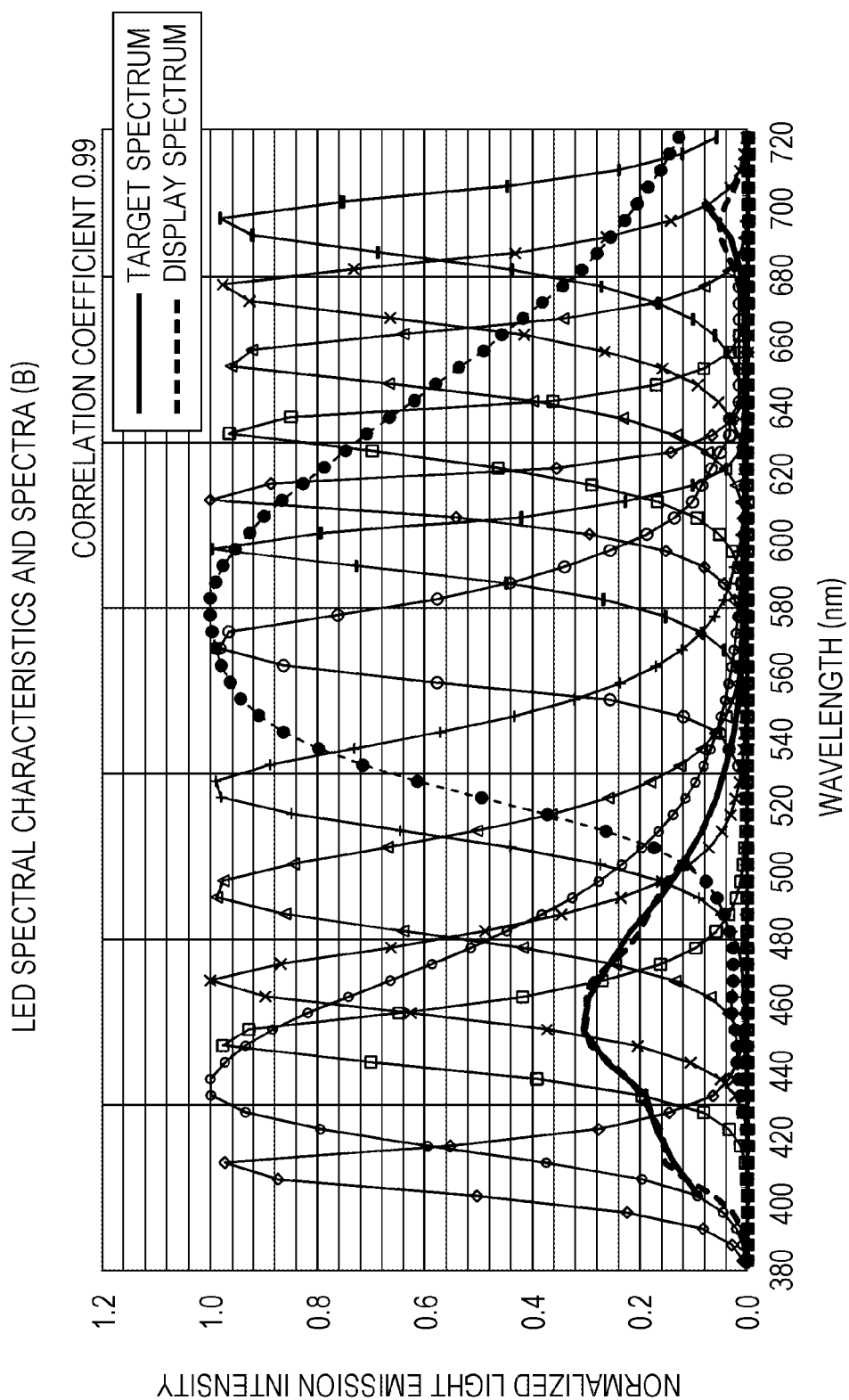
FIG. 17 is a graph that represents the spectral characteristics of the plural LEDs, the display spectrum in a case of displaying blue as the color chart, and the target spectrum as the color chart of blue.
Figure 18:
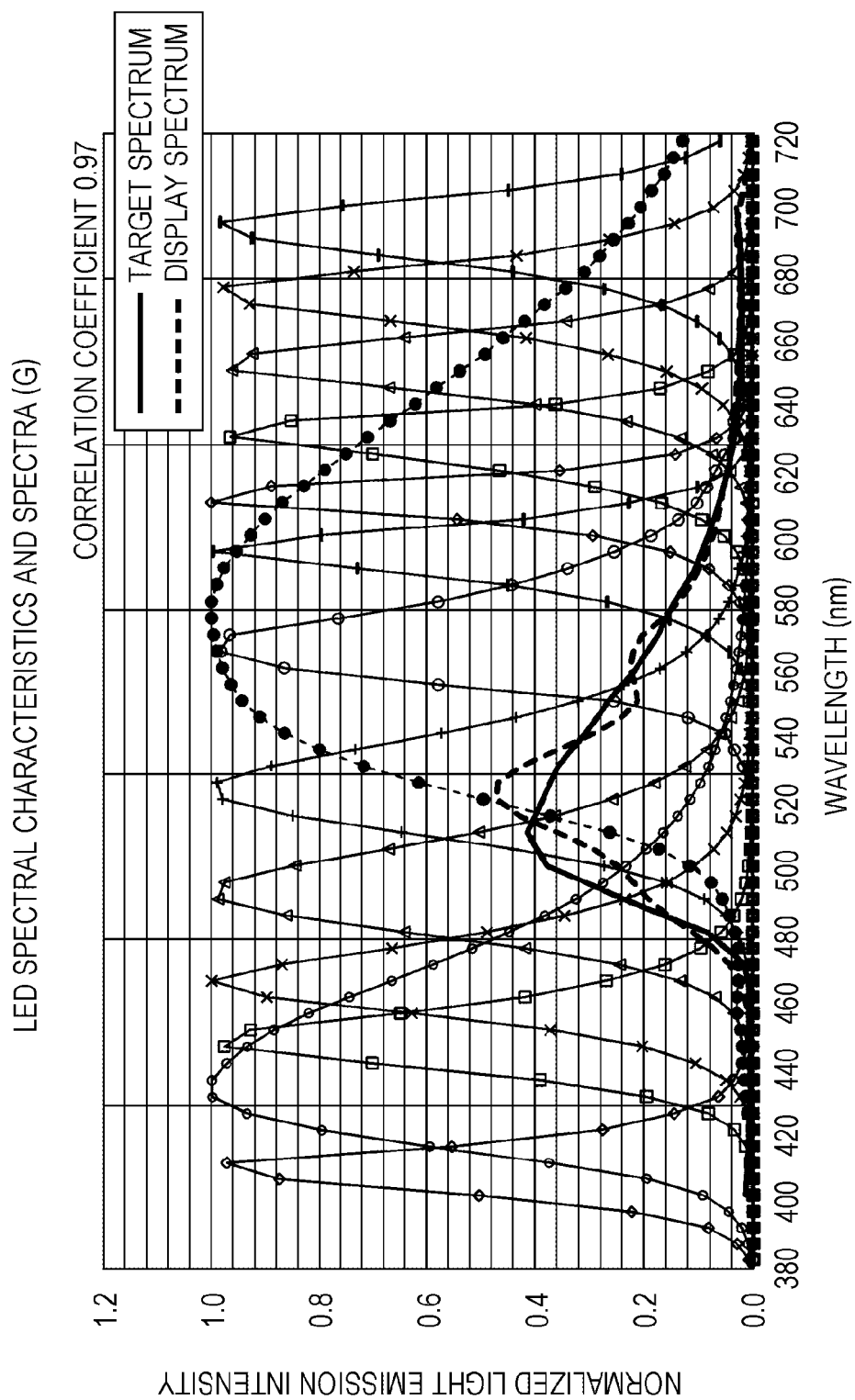
FIG. 18 is a graph that represents the spectral characteristics of the plural LEDs, the display spectrum in a case of displaying green as the color chart, and the target spectrum as the color chart of green.
Figure 19:
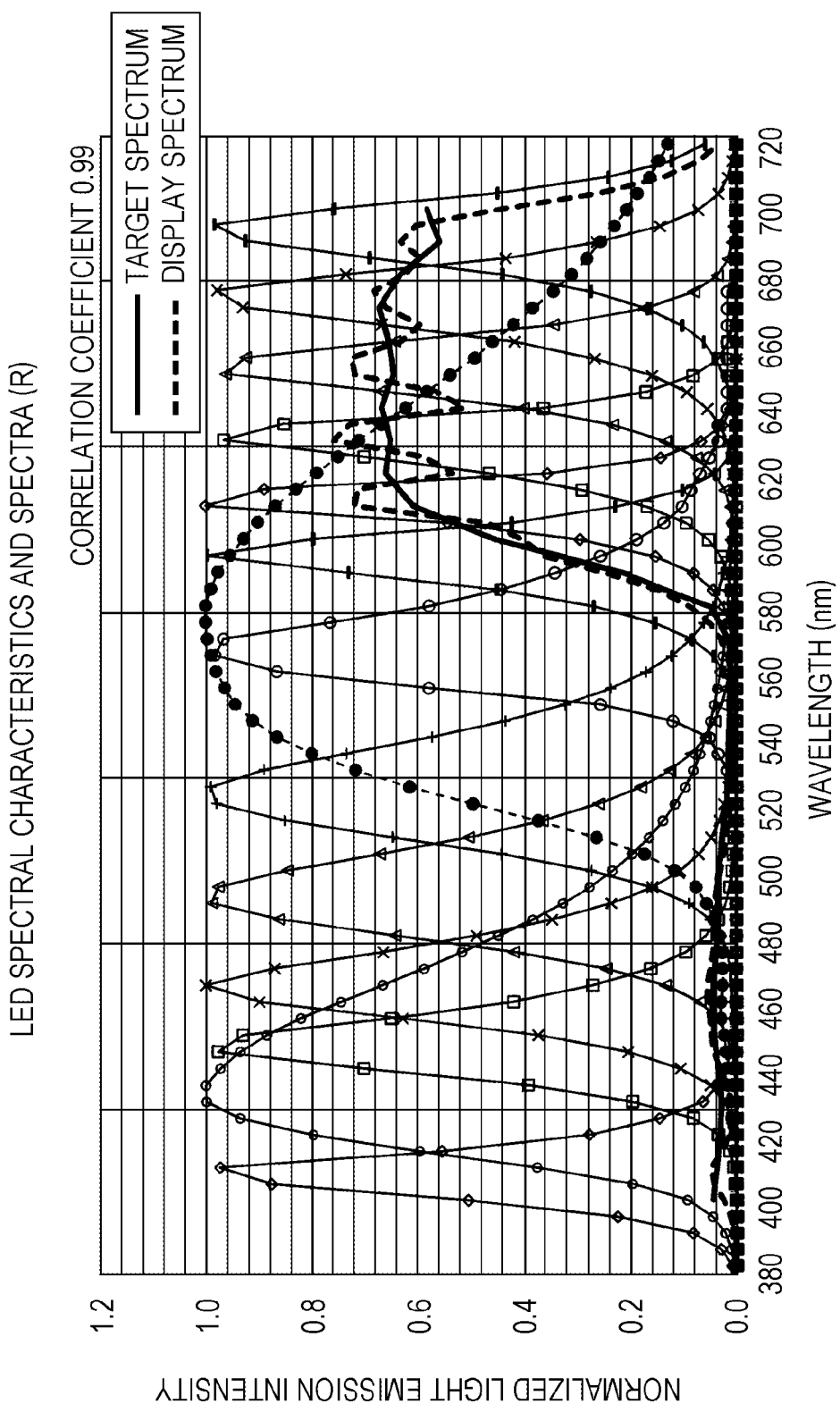
FIG. 19 is a graph that represents the spectral characteristics of the plural LEDs, the display spectrum in a case of displaying red as the color chart, and the target spectrum as the color chart of red.
Figure 20:
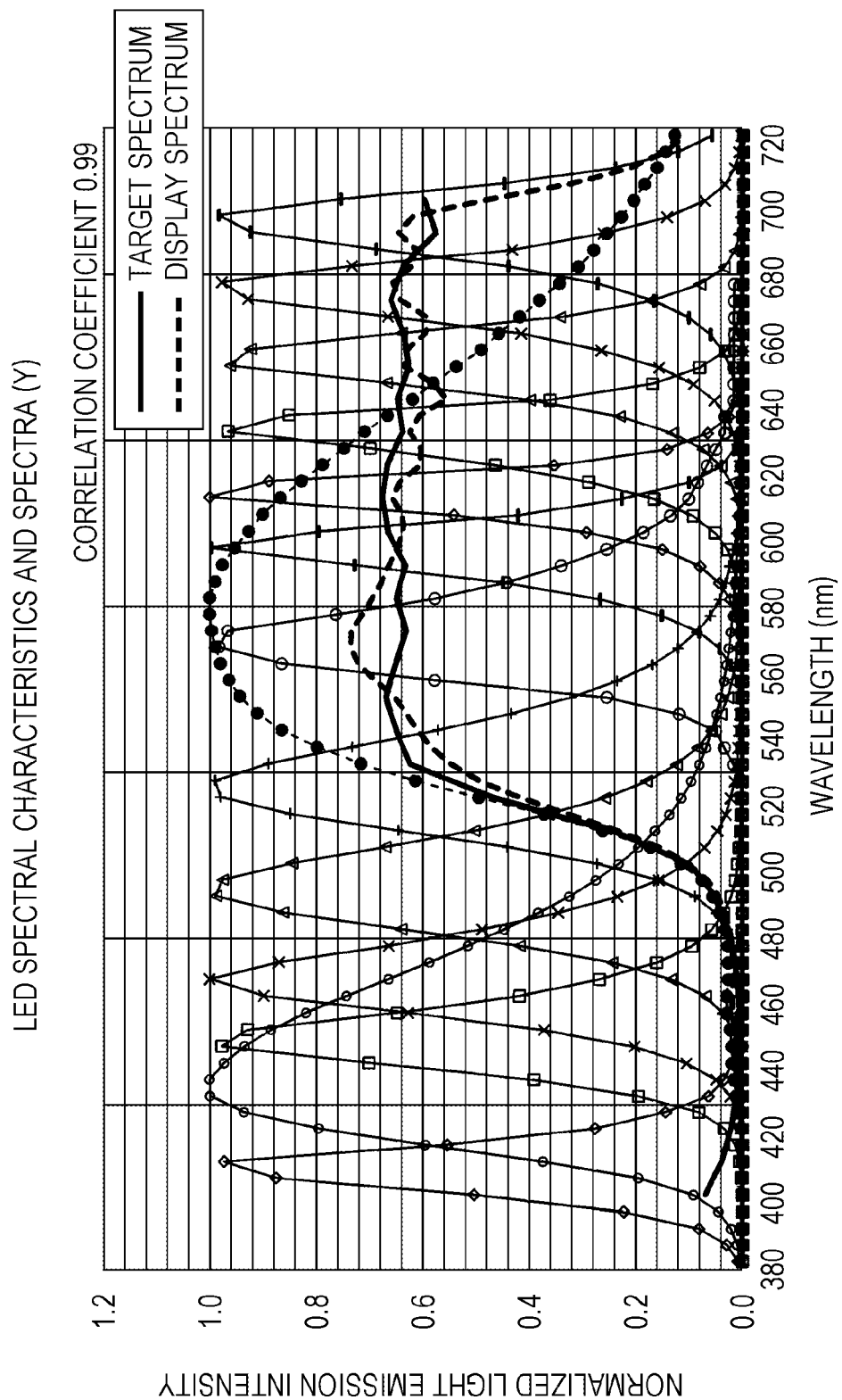
FIG. 20 is a graph that represents the spectral characteristics of the plural LEDs, the display spectrum in a case of displaying yellow as the color chart, and the target spectrum as the color chart of yellow.
Figure 21:
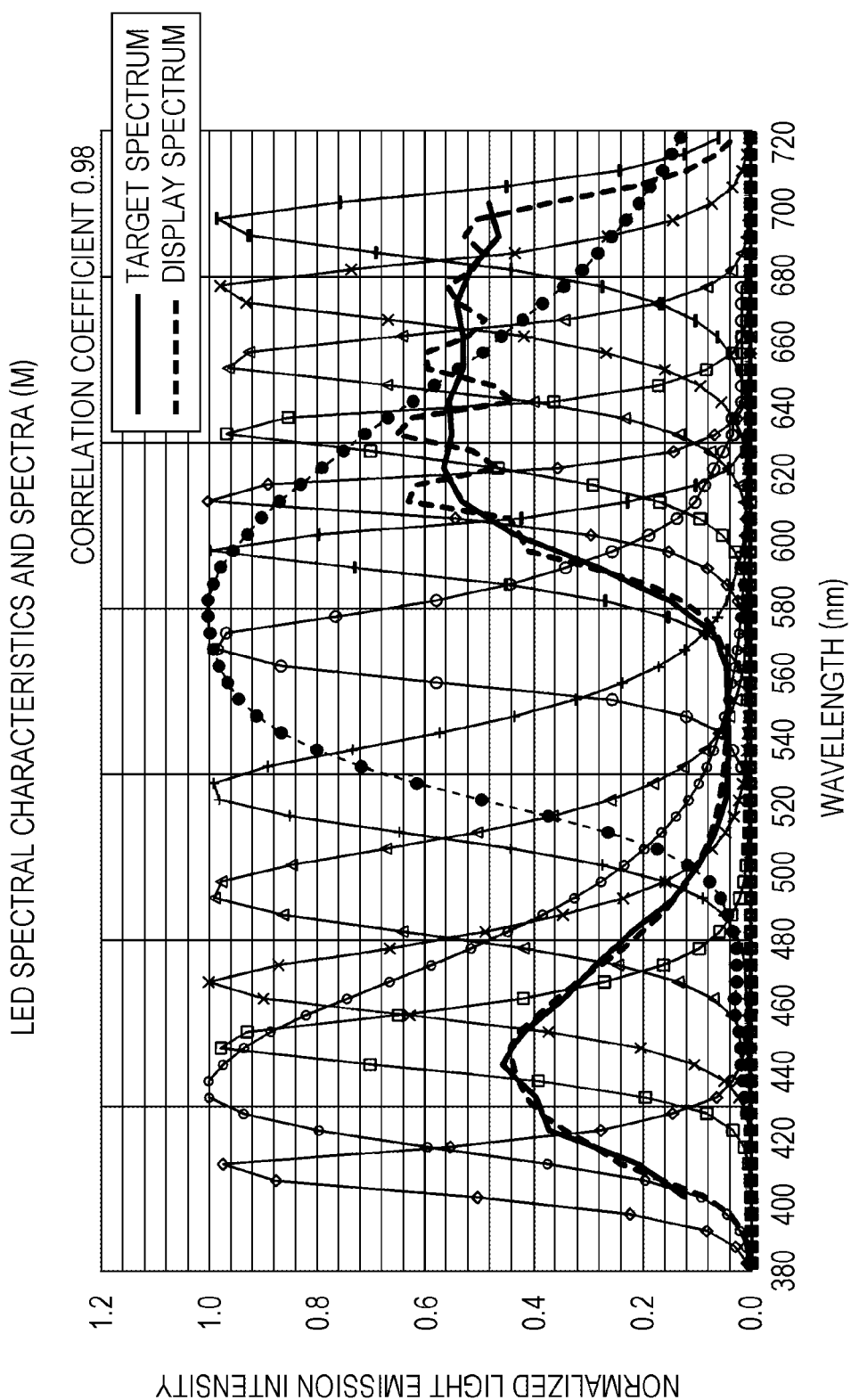
FIG. 21 is a graph that represents the spectral characteristics of the plural LEDs, the display spectrum in a case of displaying magenta as the color chart, and the target spectrum as the color chart of magenta.
Figure 22:
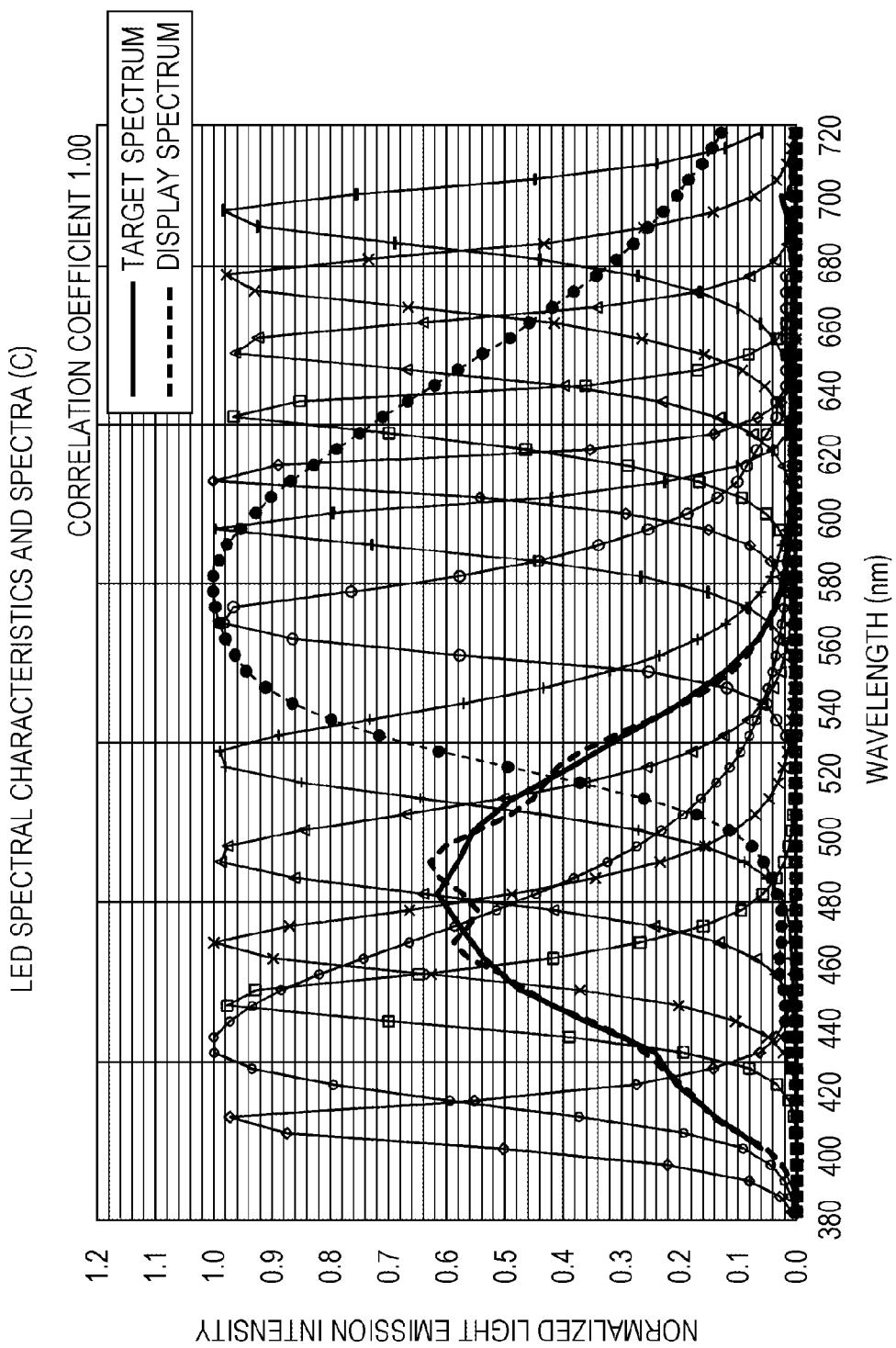
FIG. 22 is a graph that represents the spectral characteristics of the plural LEDs, the display spectrum in a case of displaying cyan as the color chart, and the target spectrum as the color chart of cyan.

FIG. 16 represents the spectral characteristics of the plural LEDs, the target spectrum (bold solid line), and the display spectrum (bold broken line) in comparative example 5 in combination. In comparative example 5, an LED whose light emission intensity at a wavelength of 555 nm was 0.3 or higher to lower than 0.4 was used as the second LED 2b of example 1. The peak wavelength of the second LED 2b was 610 nm, and the half-intensity width was 95 nm in this case. Further, when the "white" as the color chart was displayed, the plural first LEDs 2a and the second LED 2b were made emit light.

In comparative example 5, the correlation coefficient was 0.847, which was slightly lower than 0.85 that was the targeted and minimum necessary value.

(Discussion about Spectra)

Results of the above examples and comparative examples will be summarized below.

In a case where the plural first LEDs 2a among which the peak intervals are 50 nm or shorter include the LED with the half-intensity width of 40 nm or narrower, the intensities tend to lower between the adjacent peak wavelengths. Such lowering in the intensity is particularly likely to occur around a wavelength of 555 nm. A reason is that the LEDs which have the peak wavelength around 555 nm and the half-intensity width of 40 nm or narrower are only the ones with low luminous efficacy in reality and the intensity around 555 nm may not largely be increased even if the above LED is used. As a result, when "white" as the color chart is displayed, the intensity of the spectrum around a wavelength of 555 nm lowers, and the correlation coefficient may not be increased to 0.85 or higher that is the targeted value (see comparative example 4). In a case where the LED with low luminous efficacy is not included, the intensity of the spectrum around a wavelength of 555 nm further lowers, and the correlation coefficient of the display spectrum thus lowers to a value around 0.8 (see comparative example 1).

However, in a case where the light source portion 2 includes the second LED 2b whose light emission intensity is 0.4 or higher and whose half-intensity width is wider than 40 nm in addition to the plural first LEDs 2a, when "white" as the color chart is displayed by making those emit light, the intensity of the spectrum that tends to lower around a wavelength of 555 nm may be supplemented by the second LED 2b. Accordingly, the error between the display spectrum and the target spectrum may be reduced, and the correlation coefficient of the display spectrum may be increased to 0.85 or higher (see examples 1 to 9).

Particularly, based on the results of examples 1 and 7 to 9 and comparative example 5, it may be said that the second LED 2b has to have a light emission intensity of 0.4 or higher at a wavelength of 555 nm to realize the correlation coefficient of the display spectrum of 0.85 or higher in displaying "white" as the color chart.

Further, in any of the examples, the peak wavelength of the second LED 2b is 574 nm and is larger than 555 nm. The second LED 2b has the broad light emission characteristic with the wide half-intensity width and may thus realize a light emission intensity of 0.4 or higher at a wavelength of 555 nm even if the peak wavelength does not correspond to 555 nm. Further, as described above, the second LED 2b with the peak wavelength of larger than 555 nm and the half-intensity width of wider than 40 nm may be configured by using the LED chip 21 that emits blue light and the phosphor 22 that emits yellow fluorescence. Accordingly, the intensity around a wavelength of 555 nm may certainly be supplemented by using such an LED.

Further, in a case where the first LEDs 2a include the LED with the peak wavelength within a range of 680 nm to 720 nm, light emission of the above LED may supplement the intensity around a wavelength of 700 nm when "white" as the color chart is displayed. This enables realization of the correlation coefficient higher than example 1 (see example 3).

Further, in a case where the first LEDs 2a further include the LED with the peak wavelength within a range of 380 nm to 420 nm, the intensity around a wavelength of 400 nm may be supplemented by further making the above LED emit light when "white" as the color chart is displayed. This allows the display spectrum to approach the target spectrum in a wide range of wavelengths of 400 nm to 700 nm and enables realization of the correlation coefficient further higher than examples 1 and 3 (see example 2).

The light source portion 2 of this embodiment has a configuration in which the intensity around a wavelength of 555 nm is supplemented by the second LED 2b. Thus, when the light source portion 2 has the second LED 2b, the plural first LED 2a of the light source portion 2 may or may not include the LED with the peak wavelength around 555 nm and the narrow half-intensity width (the LED with low luminous efficacy) as in the above-described examples. Hypothetically, even if the plural first LEDs 2a include the LED with low luminous efficacy, the influence of the above LED on the correlation coefficient is low. Thus, the correlation coefficient of the display spectrum does not fall below 0.85 when "white" as the color chart is displayed.

(Spectra of Other Colors)

In the above, a description is made about examples where "white" as the color chart is displayed. However, the configuration of the light source portion 2 of this embodiment may provide the display spectrum that is close to the target spectrum even in a case where colors other than "white" are displayed as the color charts.

FIGS. 17 to 22 are graphs that in combination represent the spectral characteristics of the LEDs (the first LEDs 2a and the second LED 2b) of the light source portion 2, the display spectra (bold broken lines) in cases where the LEDs are controlled to display colors of B (blue), G (green), R (red), Y (yellow), M (magenta), and C (cyan) as the color charts, and the respective target spectra (bold solid lines) as the color charts of the colors. The correlation coefficients of the display spectra with respect to the target spectra in a case where the colors B, G, R, Y, M, and C were displayed as the color charts were 0.99, 0.97, 0.99, 0.99, 0.98, and 1.00, respectively.

The target spectrum of "white" as the color chart is represented by a relatively mild curve as illustrated in the drawings for the above-described examples. On the other hand, as FIGS. 17 to 22, the target spectra of the other colors have a wavelength area where the intensity becomes almost zero. Thus, it is difficult to reproduce the display spectrum close to the target spectrum in a case where "white" as the color chart is displayed when the plural LEDs with different peak wavelengths are used to display the color chart compared to a case where the other colors as the color charts are displayed.

However, as described above, this embodiment allows the correlation coefficient of the display spectrum to be increased with respect to "white" for which increasing the correlation coefficient is the most difficult among the color charts. Accordingly, it is possible to realize further higher correlation coefficients with respect to the other colors.

Figure 23:
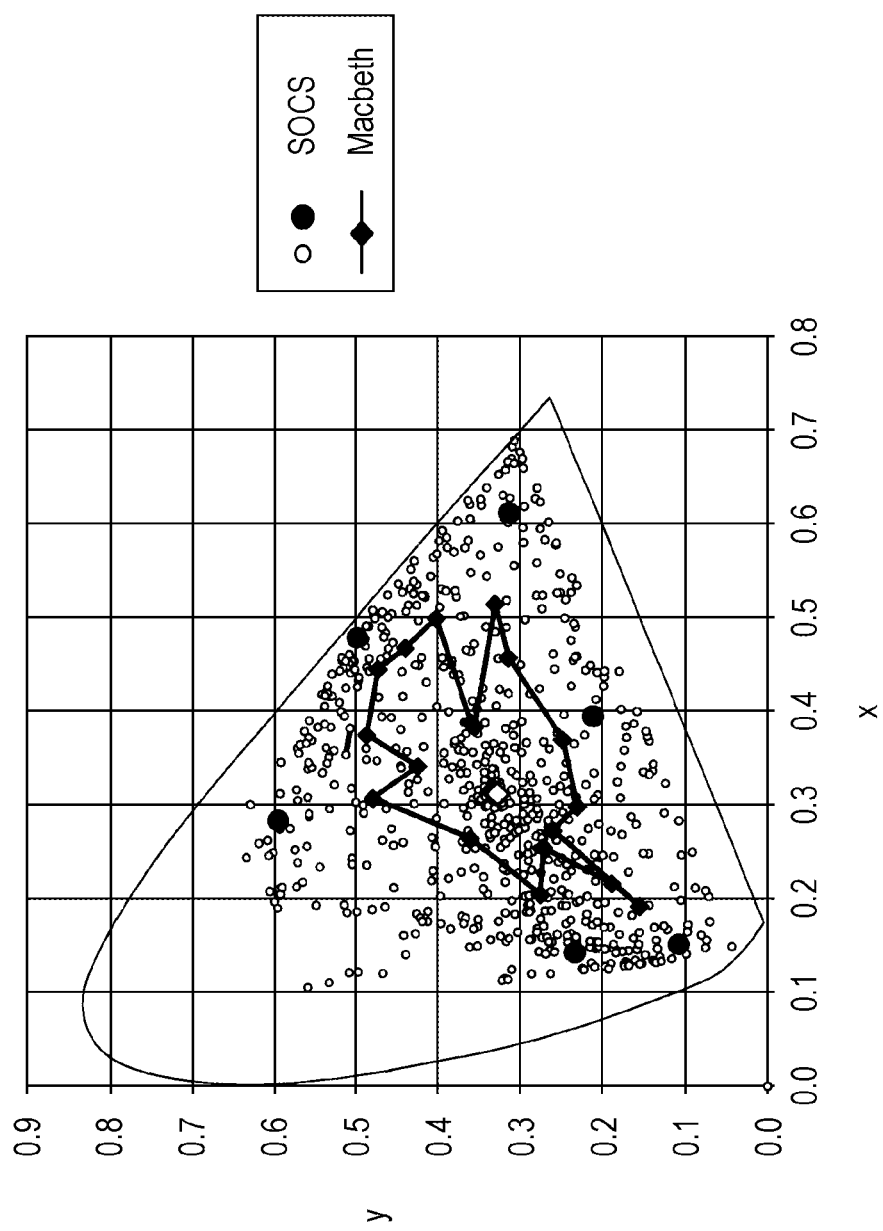
FIG. 23 is an explanatory diagram that represents colors of color charts indicated in the Macbeth chart and SOCS data on an xy chromaticity diagram in an XYZ color system.
Figure 24:
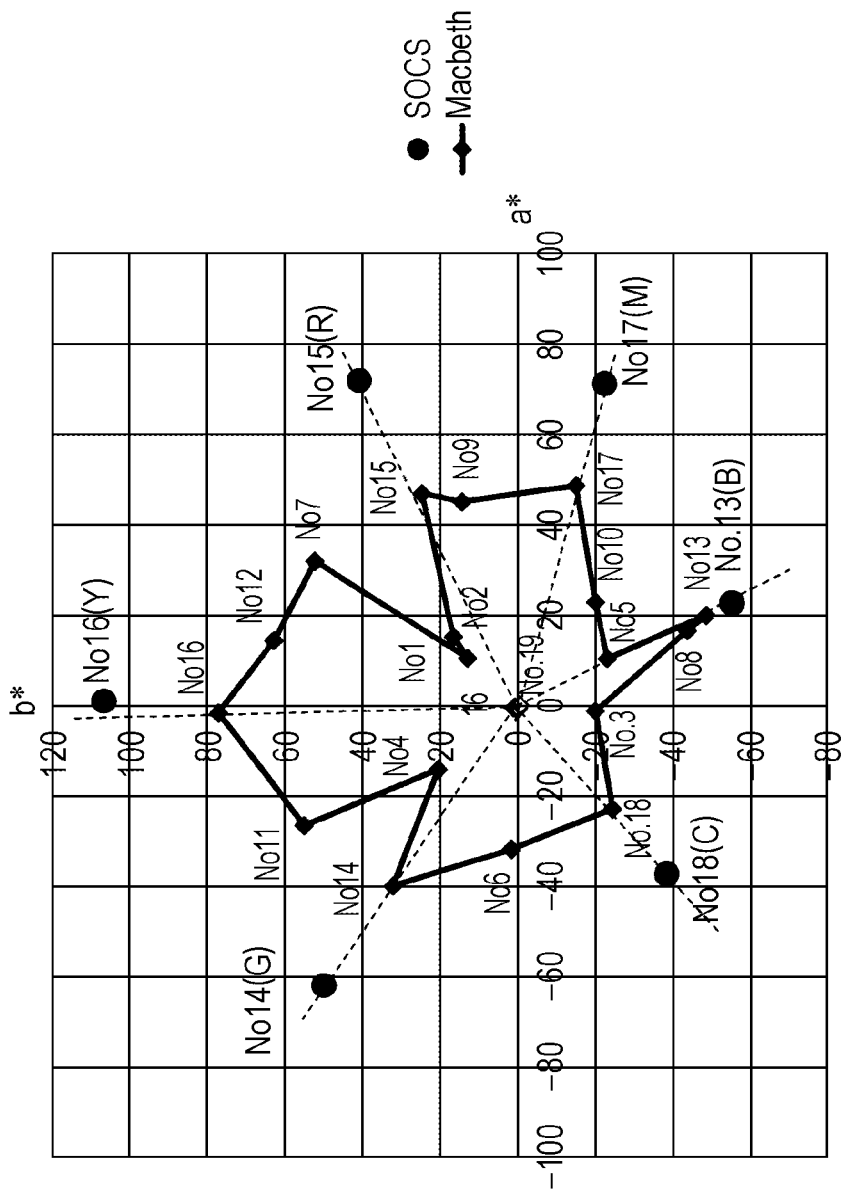
FIG. 24 is an explanatory diagram that represents the colors of the color charts indicated in the Macbeth chart and a portion of the SOCS data by coordinates in a Lab color system.

Further, FIG. 23 represents the colors of the color charts in the Macbeth chart and data of a standard object color spectra (SOCS) database by an xy chromaticity diagram in an XYZ color system. The SOCS is a published database that represents the distribution of object colors and systematically collects and arranges spectral reflectances of object colors. Further, FIG. 24 represents the colors of the color charts in the Macbeth chart and a portion of the SOCS data by the coordinate system of a Lab color system.

The colors of B, G, R, Y, M, and C that are displayed as the color charts in FIGS. 17 to 22 correspond to the colors of the points (six points indicated by Nos. 13 to 18) that are positioned in outermost regions at the same hue angles as the colors of B, G, R, Y, M, and C in the Macbeth chart, among SOCS data, and have higher chromas than the color charts of the Macbeth chart. The configuration of this embodiment allows the SOCS data of the six points with such high chromas to be displayed as the color charts. Thus, for example, in a case where calibration of a camera (adjustment of photographing performance) is performed by photographing the displayed color charts by the camera, the calibration may be performed with a high color gamut and high chromas. Accordingly, the electronic color-chart device that corresponds to a device of a high color gamut may be realized.

The electronic color-chart device of this embodiment that is described in the above is an electronic color-chart device that includes plural LEDs with different peak wavelengths and displays images to serve as color references as color charts by making the plural LEDs emit light, in which in a case where a light emission intensity distribution of each of the plural LEDs is normalized with a maximum intensity being a value of 1, the plural LEDs include plural first LEDs of which at least one is an LED whose full wavelength width at half maximum intensity is 40 nm or narrower and between which a peak interval is 50 nm or narrower and a second LED whose light emission intensity at a wavelength of 555 nm is 0.4 or higher and whose full wavelength width at half maximum intensity is wider than 40 nm.

In the above configuration, when the plural first LEDs are made emit light to display "white" of No. 19 in the Macbeth chart under the D65 light source as the color chart (hereinafter, also denoted as "white" as the color chart), for example, the intensity that tends to lower around a wavelength of 555 nm may be supplemented by the second LED whose light emission intensity at a wavelength of 555 nm is 0.4 or higher and whose full wavelength width at half maximum intensity is wider than 40 nm. Accordingly, even when "white" as the color chart is displayed, an error between an obtained spectrum and an idealistic spectrum as the color chart may be reduced, and a spectrum that is close to the target spectrum may thereby be obtained.

In this case, the peak wavelength of the second LED may be longer than 555 nm. The second LED has the broad light emission characteristic with a wide full wavelength width at half maximum intensity and may thus realize a light emission intensity of 0.4 or higher at a wavelength of 555 nm and thereby supplement the intensity that tends to lower around a wavelength of 555 nm even if the peak wavelength does not correspond to 555 nm.

Further, the second LED may be configured to include an LED chip that emits light and a phosphor that receives light that is emitted by the LED chip and emits fluorescence. Because the second LED is configured to include the phosphor, the second LED that has the broad light emission characteristic, with its full wavelength width at half maximum intensity wider than 40 nm, may certainly be realized.

The first LEDs preferably include an LED that has the peak wavelength within a range of 680 nm to 720 nm. In this case, when "white" as the color chart is displayed by making the plural LEDs emit light, the intensity around a wavelength of 700 nm is supplemented, and the obtained spectrum may thereby further approach the target spectrum.

Further, the first LEDs preferably include an LED that has the peak wavelength within a range of 380 nm to 420 nm. In this case, when "white" as the color chart is displayed by making the plural LEDs emit light, the intensity around a wavelength of 400 nm is supplemented, and the obtained spectrum may thereby approach the target spectrum still better.

(Configuration Method of Light Emission Intensities of LEDs)

In order to display the color chart equivalent to the color of the color chart to be a target in the electronic color-chart device, it is necessary to reduce the difference between the chromaticity of the displayed color chart and the chromaticity of the targeted color chart (chromaticity difference; details will be described below) other than to increase the correlation coefficient. However, above-described PTL 1 does not describe that the color chart is displayed (the light emission intensities of the LEDs are configured) in consideration of such a chromaticity difference.

A description will be made below about a configuration method of the light emission intensities of the LEDs, which increases the correlation coefficient and reduces the chromaticity difference.

As the method of configuring the light emission intensities of the LEDs so that the color charts of desired colors are displayed, two methods are possible, which are (1) configuring the light emission intensities of the LEDs for prescribed wavelengths so that the differences from respective target intensities (the light emission intensities that may provide the target spectrum) become small (refinement of spectral characteristics) and (2) configuring the light emission intensities of the LEDs so that the differences between the chromaticity of the targeted color chart and the chromaticity of the color chart that is displayed by actual light emission of the LEDs (chromaticity difference) becomes small (refinement of chromaticity).

Figure 25:
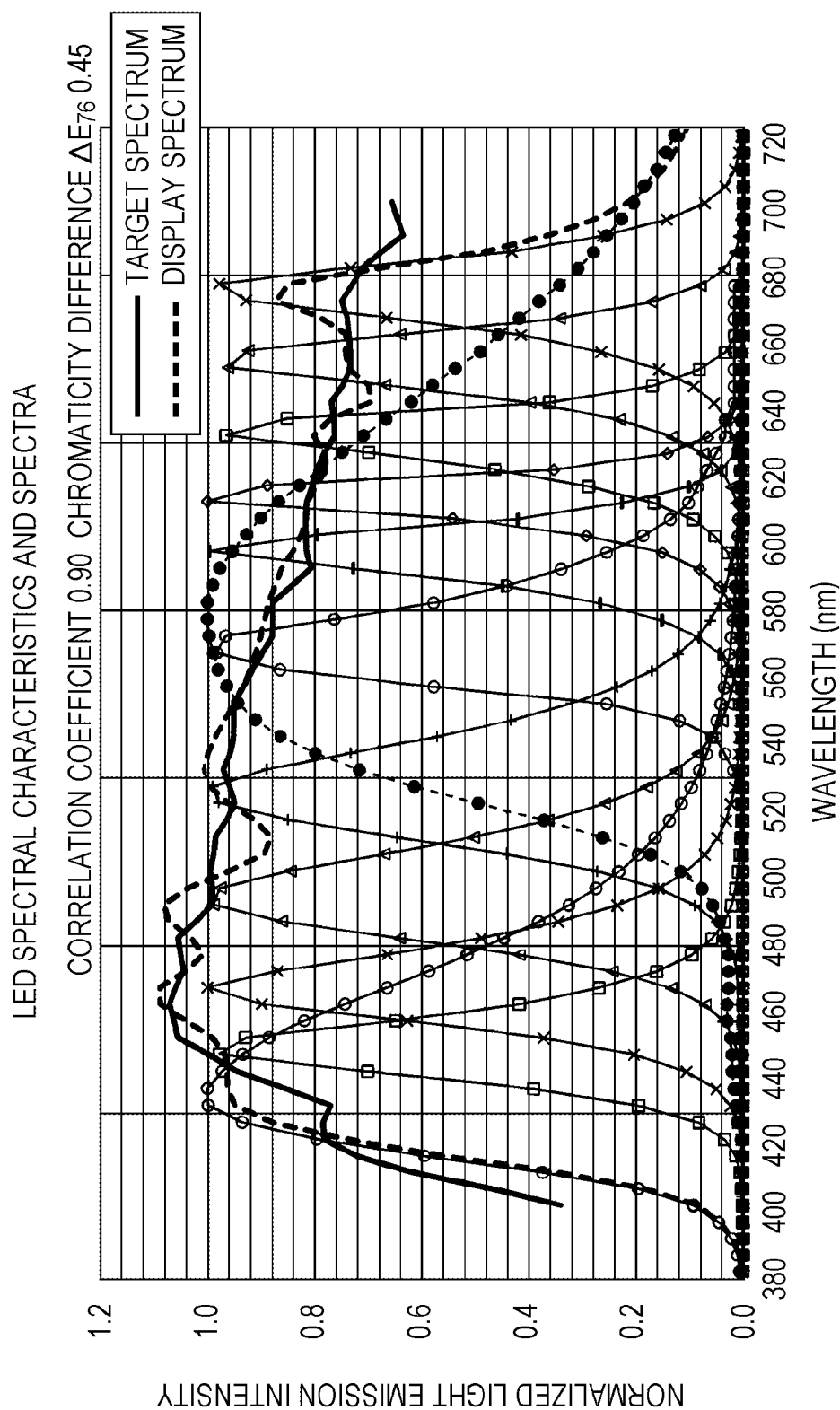
FIG. 25 is a graph that represents one example of the display spectrum in a case where "white" as the color chart is displayed by making the plural LEDs emit light.
Figure 26:
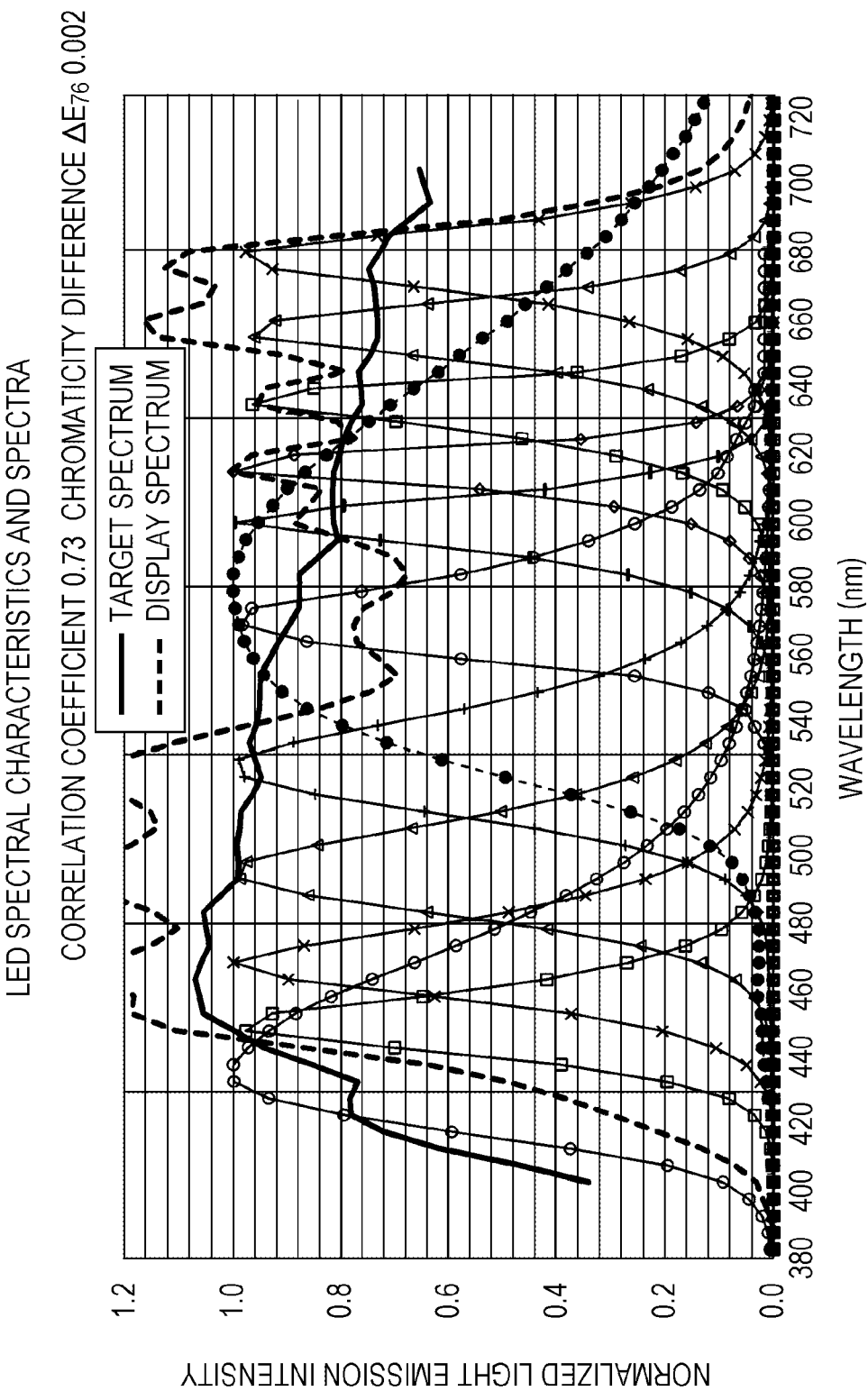
FIG. 26 is a graph that represents another example of the display spectrum in a case where "white" as the color chart is displayed by making the plural LEDs emit light.

FIGS. 25 and 26 represent one example and another example of the display spectrum (bold broken line) in a case where "white" as the color chart is displayed by making the plural LEDs emit light and correspond to cases where the light emission intensities of the LEDs are configured by the above methods of (1) and (2). In FIG. 25, the correlation coefficient of the display spectrum is 0.90, and the chromaticity difference $\Delta E_{76}$ is 0.73. In FIG. 26, the correlation coefficient of the display spectrum is 0.73, and the chromaticity difference $\Delta E_{76}$ is 0.002.

Here, the chromaticity difference $\Delta E_{76}$ represents the difference between the chromaticity of the targeted color chart and the chromaticity of the color chart that is actually displayed and is expressed by using a value of L* that represents lightness and values of a* and b* that are chromaticness indices representing a hue and the chroma in the Lab color system. Specifically, given that the values of L*, a*, and b* that correspond to the targeted color chart are L1*, a1*, and b1*, and the values of L*, a*, and b* that correspond to the displayed color chart are L2*, a2*, and b2*, $$\Delta E_{76} = \{(\Delta L)^2 + (\Delta a)^2 + (\Delta b)^2\}^{1/2}$$

where
$\Delta L = L1^* - L2^*$
$\Delta a = a1^* - a2^*$
$\Delta b = b1^* - b2^*$ From results of FIGS. 25 and 26, the above method of (1) may increase the correlation coefficient. However, it may not be said that the chromaticity difference $\Delta E_{76}$ may necessarily be reduced also. Further, the above method of (2) may reduce the chromaticity difference $\Delta E_{76}$ but may not increase the correlation coefficient.

Thus, in this embodiment, the correlation coefficient is increased, and the chromaticity difference is reduced by employing both of the above methods of (1) and (2). Accordingly, the color that is displayed as the color chart is certainly made approach the color of the targeted color chart. A more detailed description will be made below.

<Refinement of Spectral Characteristics>

First, the squares of the differences between the light emission intensities of the LEDs and the target intensities to realize the targeted color chart are obtained at prescribed wavelength intervals for wavelengths from 400 nm to 700 nm, and the mean thereof is set as an objective function.

For example, in a case where the intervals are provided for each 5 nm for wavelengths from 400 nm to 700 nm, the respective differences between the light emission intensities $A_1, A_2, A_3, \ldots, A_{61}$ and the target intensities $B_1, B_2, B_3, \ldots, B_{61}$ are obtained for wavelengths of 400 nm, 405 nm, 410 nm, ..., 700 nm. Then, the sum of $(A_1-B_1)^2$, $(A_2-B_2)^2$, $(A_3-B_3)^2, \ldots, (A_{61}-B_{61})^2$ is divided by the total number of 61 to obtain the mean, and the mean is set as the objective function F1.

Next, the optimal solutions for the light emission intensities $A_1, A_2, A_3, \ldots, A_{61}$ that provide the minimum value of the objective function F1 are obtained for the respective wavelengths (61 wavelengths). In general, when the amounts to be obtained are provided by relationships among multiple variables, an example of a method of obtaining the optimal solutions under appropriate constraint conditions is a solver method. The solver method is a method of obtaining the optimal values of variables in order to obtain targeted values in an equation that contains plural variables. By the solver method, the mutual relationships among the variables may be determined while the values of the plural variables are changed, and the optimal values may be calculated. Thus, the optimal light emission intensities may be obtained for the respective wavelengths by using the solver method. By the way, in a case where the amounts to be obtained are combinations of multiple linear functions, there is a linear programming method as a method of obtaining the optimal solutions under specified constraint conditions. The solver method may also be used to obtain the optimal solutions. That is, the solver method is one kind of the linear programming method.

The light emission intensities for the respective wavelengths are obtained as described above, and the light emission intensities close to the target intensities may thereby be obtained for the respective wavelengths. Thus, the correlation coefficient of the display spectrum may be increased.

<Refinement of Chromaticity>

After the light emission intensities for the respective wavelengths are obtained as described above, the obtained light emission intensities are next set as initial values, and the chromaticity difference between the chromaticity of the color chart that is displayed with the light emission intensities and the chromaticity of the targeted color chart is obtained. That is, the values of L*, a*, and b* that correspond to the targeted color chart are set as L1*, a1*, and b1*, the values of L*, a*, and b* that correspond to the color chart that is displayed with the light emission intensities are set as L2*, a2*, and b2*, and the chromaticity difference $\Delta E_{76}$ is obtained by the above-described equation.

Next, the obtained chromaticity difference $\Delta E_{76}$ is set as an objective function F2, and the optimal solutions for the light emission intensities of the respective wavelengths are obtained by finely adjusting the light emission intensities as the initial values so that the value of the objective function F2 (the chromaticity difference $\Delta E_{76}$) becomes the minimum. In this case also, the optimal solutions may be obtained by using the above-described linear programming method or solver method. The light emission intensities of the respective wavelengths that are obtained as described above are configured as the final light emission intensities.

Figure 27:
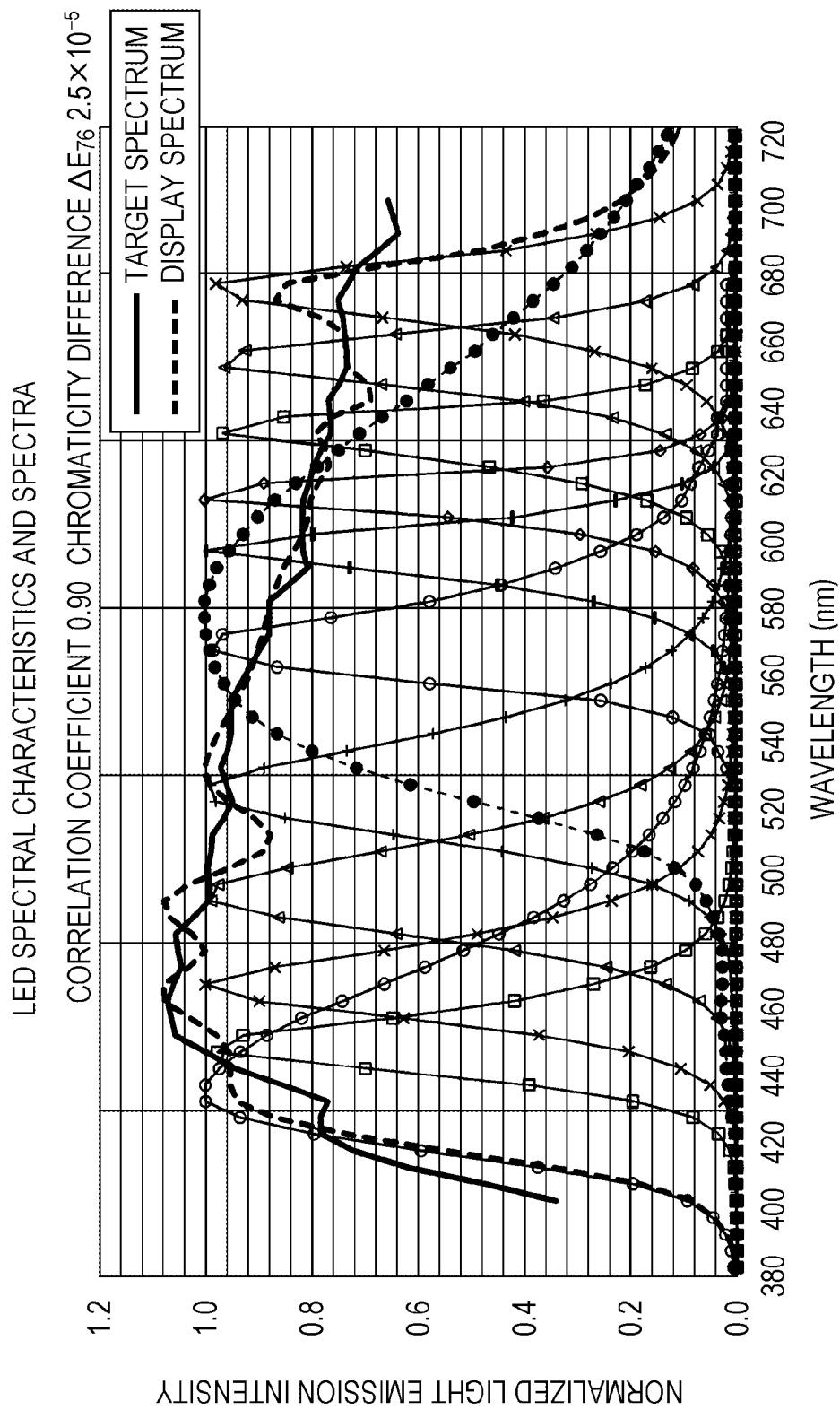
FIG. 27 is a graph that represents the display spectrum in a case where "white" as the color chart is displayed by adjusting light emission intensities in two stages.
Figure 28:
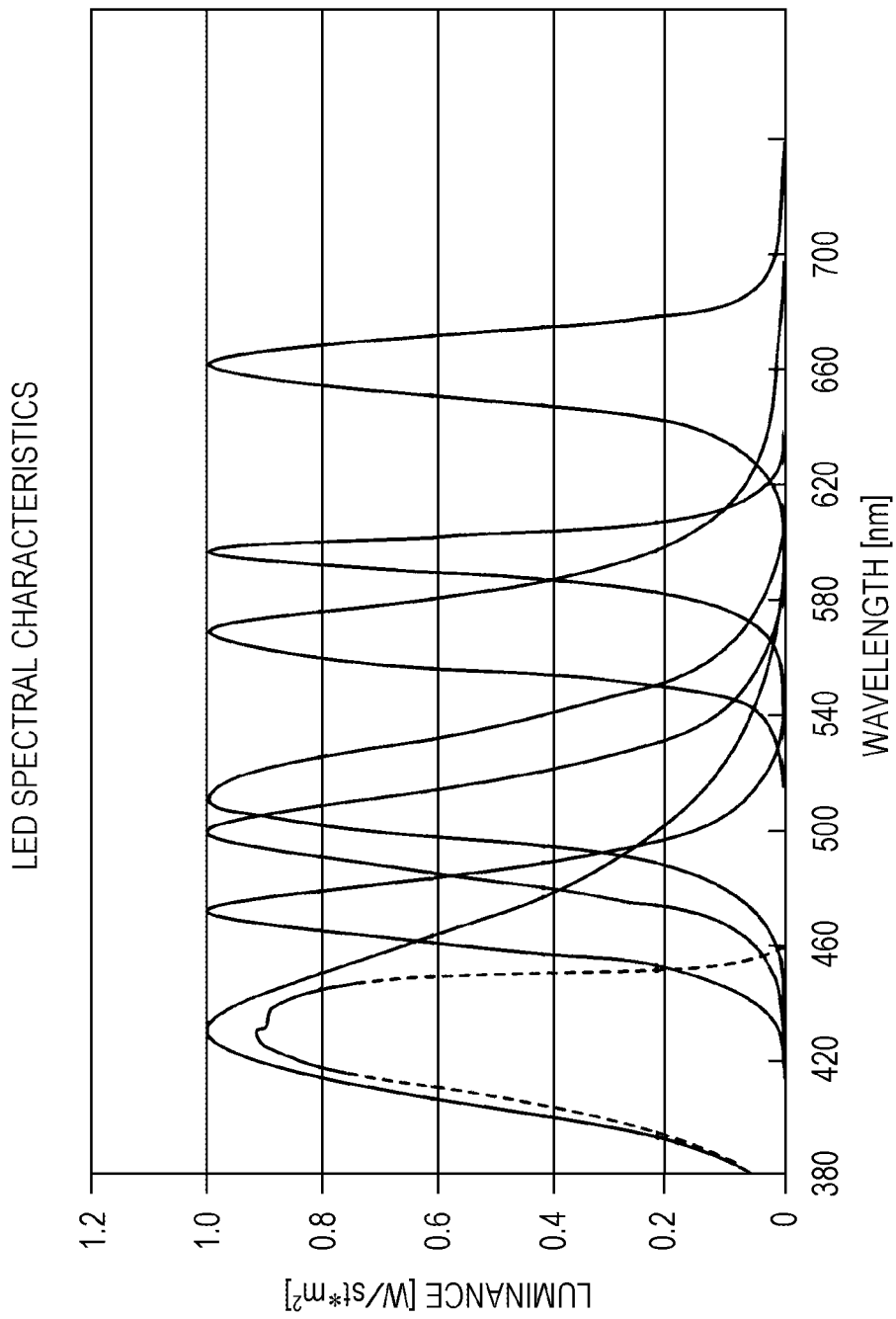
FIG. 28 is a graph that represents spectral characteristics of plural LEDs that are provided in an electronic color-chart device in related art.
Figure 29:
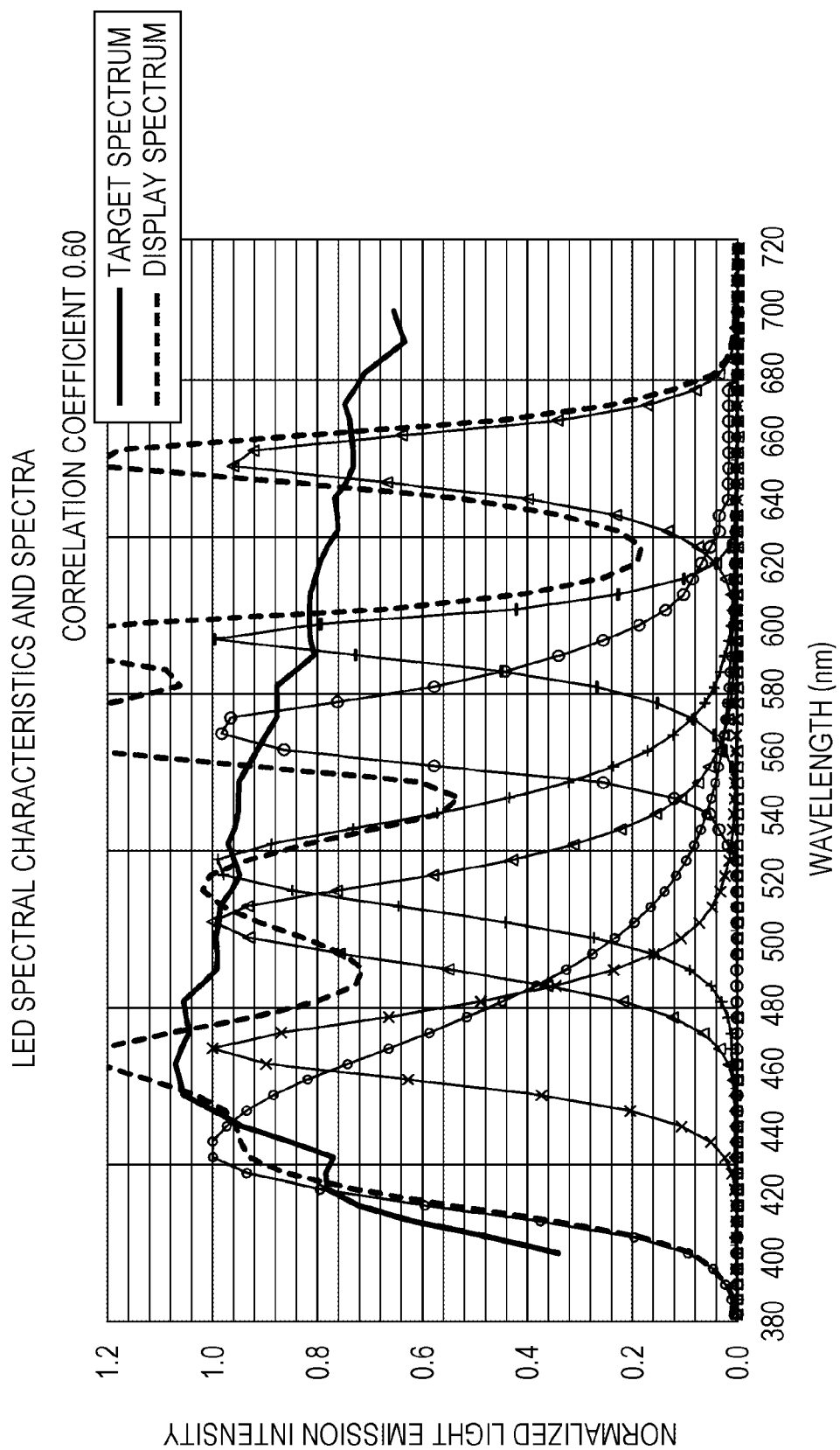
FIG. 29 is a graph that represents the display spectrum in a case where "white" as the color chart is displayed by the plural LEDs that have the spectral characteristics and the spectrum of "white" as a target.

FIG. 27 represents the display spectrum in a case where "white" as the color chart is displayed by adjusting the light emission intensities in above two stages. As described above, the light emission intensities are first obtained so that the squares of the errors from the target intensities become small. Thereafter, the obtained light emission intensities are finely adjusted so that the chromaticity difference becomes small. Accordingly, the color chart whose correlation coefficient with respect to the target is as high as 0.90 and whose chromaticity difference $\Delta E_{76}$ is almost zero may be displayed, and the color displayed as the color chart may certainly be made approach the color of the targeted color chart.

Based on the above description, the configuration method of the light emission intensities of the LEDs in this embodiment may be expressed as follows:

1. A configuration method of light emission intensities of LEDs, including:

a first step of obtaining the respective light emission intensities at plural wavelengths that are selected from a prescribed wavelength range (for example, within a range of 400 nm to 700 nm) and the light emission intensities at the respective wavelengths that provide the minimum mean of the squares of errors from target intensities to realize a targeted color chart; and a second step of obtaining a chromaticity difference between a chromaticity of the color chart that is displayed with the light emission intensities and a chromaticity of the targeted color chart by setting the light emission intensities at the respective wavelengths as initial values, obtaining the light emission intensities at the respective wavelengths so that the chromaticity difference becomes the minimum, and finely adjusting the light emission intensities that are configured as the initial values.

2. The configuration method of the light emission intensities of the LEDs that is described in above 1, in which the light emission intensities at the respective wavelengths are obtained by a linear programming method in the first step.

3. The configuration method of the light emission intensities of the LEDs that is described in above 1 or 2, in which the light emission intensities at the respective wavelengths are obtained by the linear programming method in the second step.

4. The configuration method of the light emission intensities of the LEDs that is described in above 2 or 3, in which the linear programming method is a solver method.

INDUSTRIAL APPLICABILITY

The present invention is usable for an electronic color-chart device that displays a color chart by using plural LEDs.

REFERENCE SIGNS LIST 1 electronic color-chart device
2a first LED
2b second LED
21 LED chip
22 phosphor

The invention claimed is:

1. An electronic color-chart device that includes plural LEDs with different peak wavelengths and displays images to serve as color references as color charts by making the plural LEDs emit light, wherein
in a case where a light emission intensity distribution of each of the plural LEDs is normalized with a maximum intensity being a value of 1,
the plural LEDs include
plural first LEDs of which at least one is an LED whose full wavelength width at half maximum intensity is equal to or less than 40 nm and between which a peak interval is equal to or less than 50 nm, and
a second LED whose light emission intensity at a wavelength of 555 nm is 0.4 or higher and whose full wavelength width at half maximum intensity is wider than 40 nm.

2. The electronic color-chart device according to claim 1, wherein the peak wavelength of the second LED is longer than 555 nm.

3. The electronic color-chart device according to claim 1, wherein the second LED includes an LED chip that emits light and a phosphor that receives light that is emitted by the LED chip and emits fluorescence.

4. The electronic color-chart device according to claim 1, wherein the first LEDs include an LED that has the peak wavelength within a range of 680 nm to 720 nm.

5. The electronic color-chart device according to claim 4, wherein the first LEDs include an LED that has the peak wavelength within a range of 380 nm to 420 nm.

6. The electronic color-chart device according to claim 5, wherein
the plurality of first LEDs include an LED with a peak wavelength of 435 nm, and
among the plurality of first LEDs include,
a full wavelength width at half maximum intensity of the LED with a peak wavelength of 435 nm is wider than 40 nm and a full wavelength width at half maximum intensity of all other LEDs is equal to or less than 40 nm.

7. The electronic color-chart device according to claim 1, wherein when light emission intensities at wavelengths that provide a minimum mean of squares of errors between light emission intensities at plural wavelengths that are selected from a prescribed wavelength range of 400 nm to 700 nm and target intensities to realize a targeted color chart are set as initial values, light emission intensities of the plurality of LEDs are set by finely adjusting the light emission intensities set as initial values such that a chromaticity difference between a chromaticity of a color chart that is displayed with the initial values at the respective wavelengths and a chromaticity of the targeted color chart.

* * * * *